(12) United States Patent
Yang

(10) Patent No.: US 10,559,368 B1
(45) Date of Patent: Feb. 11, 2020

(54) NON-VOLATILE MEMORY WITH COUNTERMEASURES FOR SELECT GATE DISTURB DURING PROGRAM PRE-CHARGE

(71) Applicant: SanDisk Technologies LLC, Addison, TX (US)

(72) Inventor: Xiang Yang, Santa Clara, CA (US)

(73) Assignee: SanDisk Technologies LLC, Addison, TX (US)

( * ) Notice: Subject to any disclaimer, the term of this patent is extended or adjusted under 35 U.S.C. 154(b) by 15 days.

(21) Appl. No.: 16/056,838

(22) Filed: Aug. 7, 2018

(51) Int. Cl.
| | | |
|---|---|---|
| *G11C 16/34* | (2006.01) | |
| *G11C 5/02* | (2006.01) | |
| *G11C 7/12* | (2006.01) | |
| *H01L 27/11* | (2006.01) | |
| *G11C 8/08* | (2006.01) | |
| *G11C 16/10* | (2006.01) | |
| *G11C 16/28* | (2006.01) | |
| *H01L 27/11582* | (2017.01) | |
| *H01L 27/1157* | (2017.01) | |
| *G11C 16/04* | (2006.01) | |

(Continued)

(52) U.S. Cl.
CPC .......... *G11C 16/3427* (2013.01); *G11C 5/025* (2013.01); *G11C 7/12* (2013.01); *G11C 8/08* (2013.01); *G11C 16/0483* (2013.01); *G11C 16/10* (2013.01); *G11C 16/28* (2013.01); *H01L 27/1157* (2013.01); *H01L 27/11582* (2013.01); *H01L 27/11524* (2013.01); *H01L 27/11556* (2013.01)

(58) Field of Classification Search
CPC ....... G11C 16/3427; G11C 5/025; G11C 7/12; G11C 8/08; G11C 16/0483; G11C 16/10; G11C 16/28; H01L 27/1157; H01L 27/11582
See application file for complete search history.

(56) References Cited

U.S. PATENT DOCUMENTS

| | | | |
|---|---|---|---|
| 6,188,609 B1 | 2/2001 | Sunkavalli et al. | |
| 7,463,531 B2 * | 12/2008 | Hemink | G11C 11/5628 365/185.17 |

(Continued)

OTHER PUBLICATIONS

U.S. Appl. No. 15/798,648, filed Oct. 31, 2017, by Reusswig et al.

*Primary Examiner* — Tri M Hoang
(74) *Attorney, Agent, or Firm* — Vierra Magen Marcus LLP

(57) ABSTRACT

Program disturb is a condition that includes the unintended programming while performing a programming process for memory cells, where the program disturb can affect both memory cells and select gates in a NAND structure. During a pre-charge phase of a programming operation, a drain side select gate may be biased to a higher voltage than an adjacent word line, resulting in a disturb of the select gate due to hot-electron injection. This can raise the threshold voltage of the select gate, causing error in reading the NAND string or even making it inaccessible. To help avoid this problem, during a program pre-charge, the voltage applied to the select gate is raised in a sequence of steps, rather than driving the select gate directly to its final pre-charge voltage level.

20 Claims, 20 Drawing Sheets

(51) Int. Cl.
    *H01L 27/11524*     (2017.01)
    *H01L 27/11556*     (2017.01)

(56) References Cited

U.S. PATENT DOCUMENTS

| | | | | |
|---|---|---|---|---|
| 7,486,554 | B2 * | 2/2009 | Park | G11C 16/0483 365/185.02 |
| 7,558,117 | B2 * | 7/2009 | Maejima | G11C 16/08 365/185.18 |
| 8,385,115 | B2 * | 2/2013 | Lee | G11C 16/0483 365/185.02 |
| 8,427,881 | B2 * | 4/2013 | Jang | G11C 16/0483 365/185.02 |
| 8,537,617 | B2 | 9/2013 | Kim et al. | |
| 8,670,285 | B2 | 3/2014 | Dong et al. | |
| 8,854,890 | B1 * | 10/2014 | Miwa | G11C 16/0483 365/185.02 |
| 9,202,538 | B2 | 12/2015 | Gupta et al. | |
| 9,286,994 | B1 | 3/2016 | Chen et al. | |
| 9,336,892 | B1 | 5/2016 | Chen et al. | |
| 9,361,993 | B1 | 6/2016 | Chen et al. | |
| 9,368,222 | B2 * | 6/2016 | Dunga | G11C 16/24 |
| 9,406,391 | B1 | 8/2016 | Chen et al. | |
| 9,412,463 | B1 | 8/2016 | Chen et al. | |
| 9,761,320 | B1 | 9/2017 | Chen et al. | |
| 9,830,992 | B1 | 11/2017 | Tsai et al. | |
| 9,887,002 | B1 | 2/2018 | Zhang et al. | |
| 9,905,305 | B2 | 2/2018 | Chen et al. | |
| 9,922,705 | B1 | 3/2018 | Diep et al. | |
| 2009/0097325 | A1 | 4/2009 | Won et al. | |
| 2014/0369125 | A1 | 12/2014 | Della Mina et al. | |
| 2017/0352430 | A1 | 12/2017 | Chen et al. | |

* cited by examiner

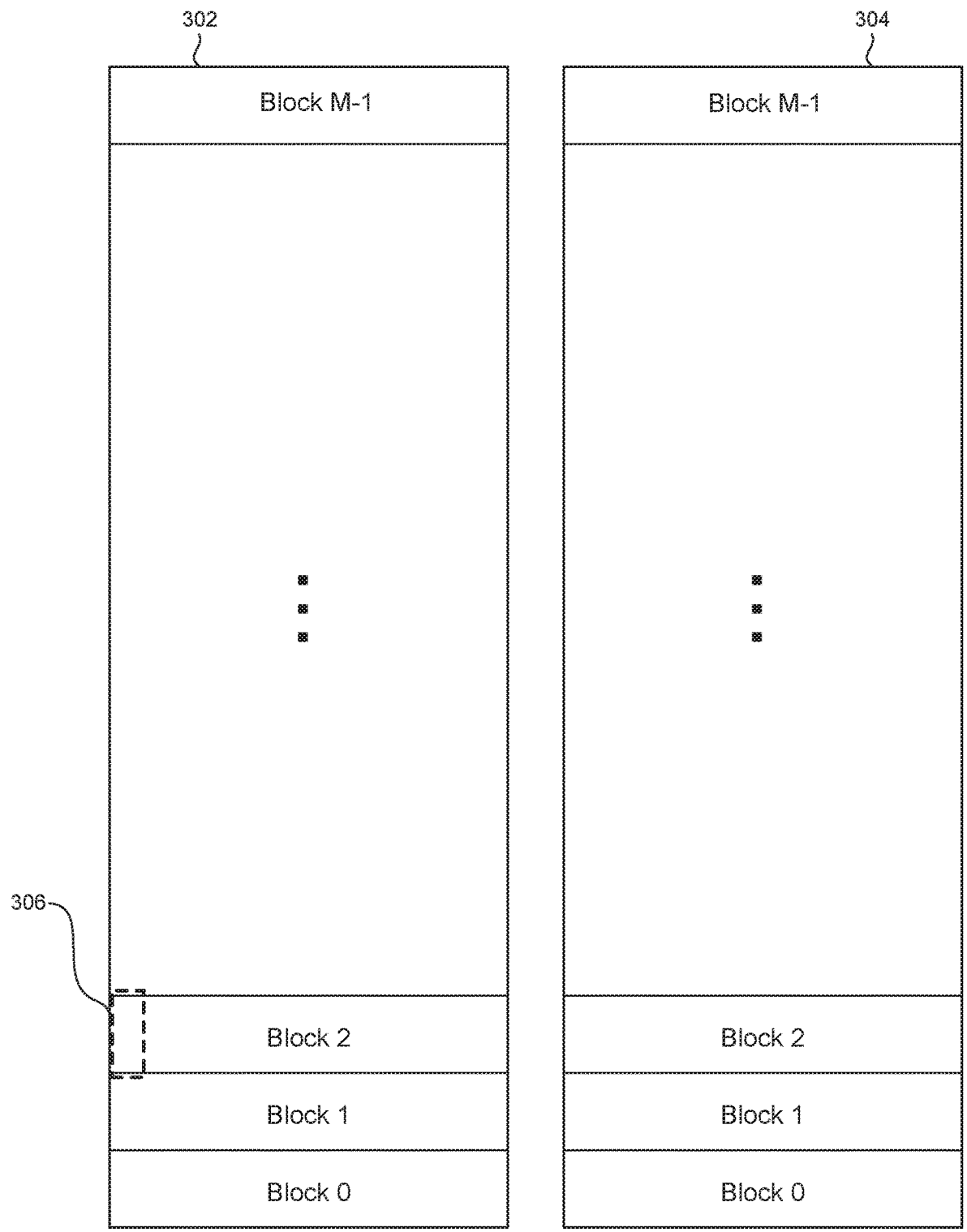

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

NON-VOLATILE MEMORY WITH COUNTERMEASURES FOR SELECT GATE DISTURB DURING PROGRAM PRE-CHARGE

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems can be used to store data provided by a host device, client, user or other entity. It is important that when data stored in the memory system is read back and reported to the host device, client, user or other entity, the data is reported back accurately.

BRIEF DESCRIPTION OF THE DRAWINGS

Like-numbered elements refer to common components in the different figures.

FIG. 4A is a block diagram of a memory structure having two planes.

DETAILED DESCRIPTION

Program disturb is a condition that includes the unintended programming of one or more locations in a memory system while performing a programming process for other locations in the memory system. In some memory structures, program disturb can affect both memory cells and select gates. For example, during a pre-charge phase of a programming operation, a drain side select gate may be biased to a higher voltage than an adjacent word line, resulting in a disturb of the select gate due to hot-electron injection into a charge storage under or near the select gate from the channel region under the select gate and adjacent word line. This can raise the threshold voltage of the select gate, causing errors when reading data stored in the memory.

To help avoid select gate disturb during the pre-charge phase of a programming operating, the voltage applied to the select gate is raised in a sequence of steps of increasing voltage, rather than driving the select gate directly at its final pre-charge voltage level. While an adjacent word line, whether a dummy word line or data word line, is biased at its pre-charge level, the select gate is biased with a staircase waveform. This can help to reduce both the generation of electron-hole pairs in the channel regions and, for any such pairs generated, reduce the electron field that can lead to hot-electron injection. A number of embodiments can be used for the select gate's pre-charge staircase waveform, including just a two step sequence; a ramp-like staircase of a larger number of steps having a uniform step size and duration; or a ramp-like staircase of a larger number of steps, but with a variable ramp rate, to give some examples.

Figure 1:
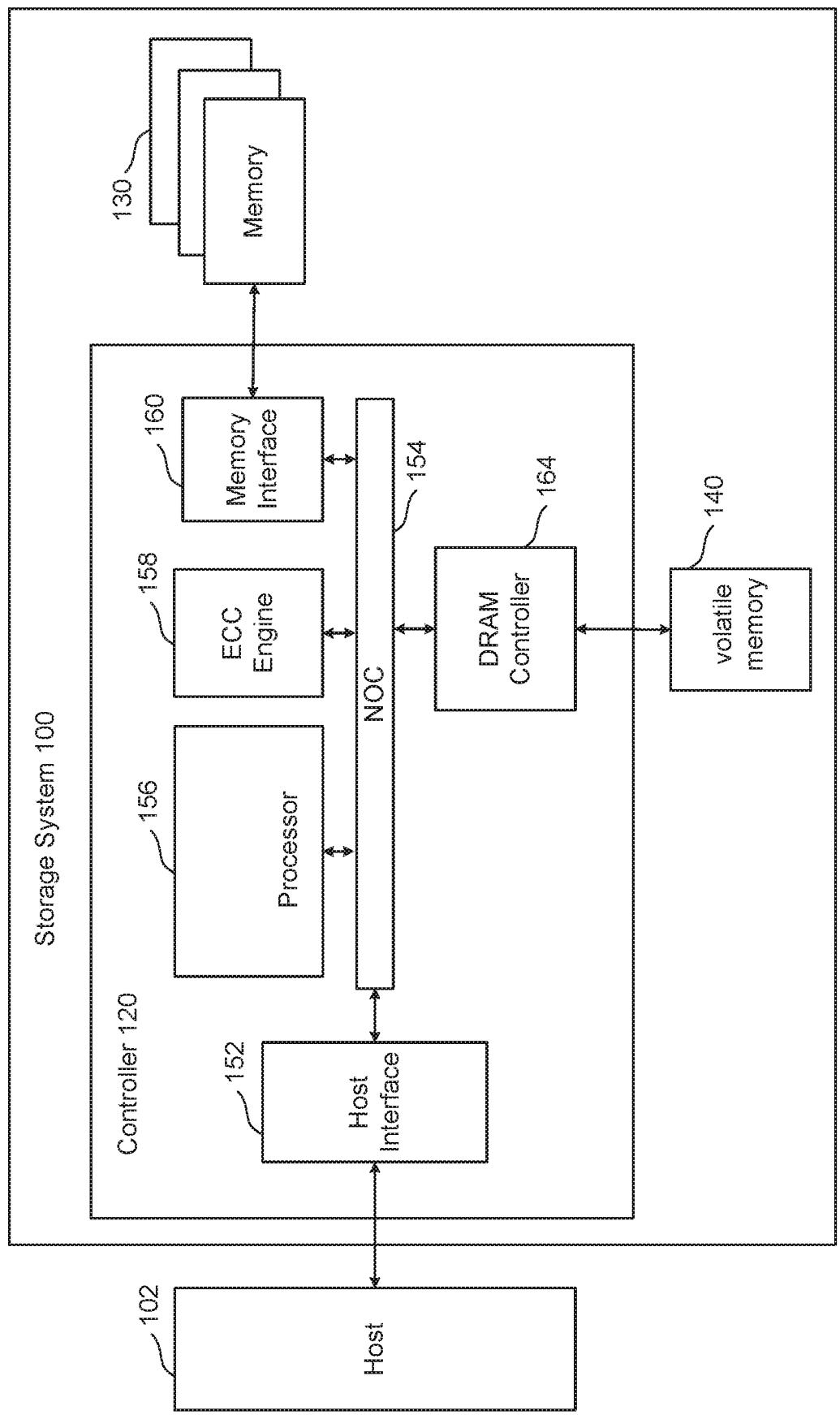
FIG. 1 is a block diagram depicting one embodiment of a memory system.

FIG. 1 is a block diagram of one embodiment of a memory system 100 that implements the proposed technology, including the countermeasure for avoiding program disturb to the select gate discussed in detail below. In one embodiment, storage system 100 is a solid state drive ("SSD"). Memory system 100 can also be a memory card, USB drive or other type of storage system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a controller 120 connected to one or more memory die 130 and local high speed volatile memory 140 (e.g., DRAM). The one or more memory die 130 each comprise a plurality of non-volatile memory cells. More information about the structure of each memory die 130 is provided below with respect to FIG. 2. Local high speed volatile memory 140 is used by controller 120 to perform certain functions. For example, local high speed volatile memory 140 stores logical to physical address translation tables ("L2P tables.")

Controller 120 comprises a host interface 152 that is connected to and in communication with host 102. In one embodiment, host interface 152 provides a PCIe interface. Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, as well as memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To enable this system, the controller (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with one or more memory die 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2:
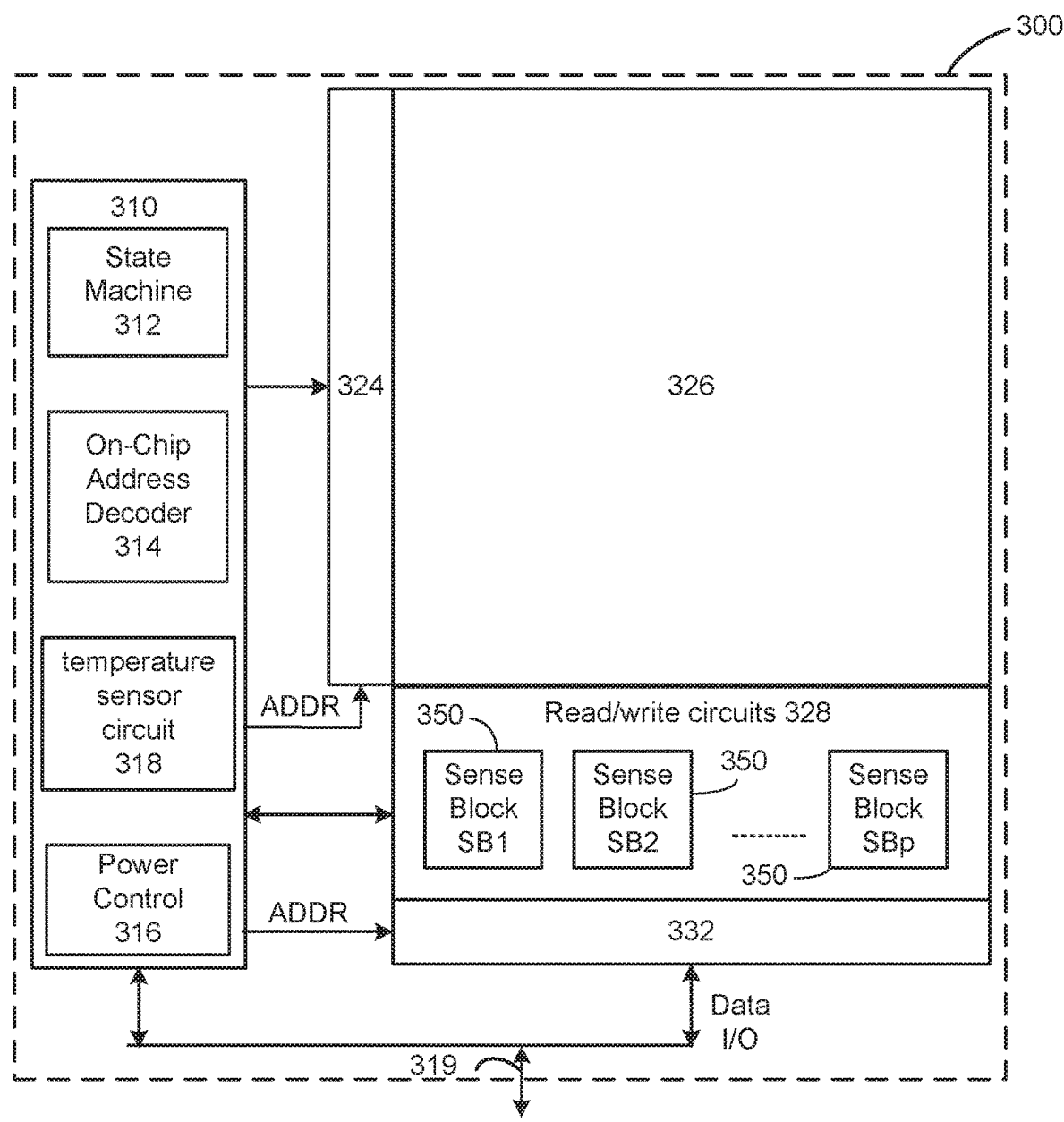
FIG. 2 is a block diagram of one embodiment of a memory die.

FIG. 2 is a functional block diagram of one embodiment of a memory die 300. Each of the one or more memory die 130 of FIG. 1 can be implemented as memory die 300 of FIG. 2. The components depicted in FIG. 2 are electrical circuits. In one embodiment, each memory die 300 includes a memory structure 326, control circuitry 310, and read/write circuits 328. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed (written) in parallel. In one embodiment, each sense block includes a sense amplifier and a set of latches connected to the bit line. The latches store data to be written and/or data that has been read. The sense amplifiers include bit line drivers. Commands and data are transferred between the controller and the memory die 300 via lines 319. In one embodiment, memory die 300 includes a set of input and/or output (I/O) pins that connect to lines 319.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316 and a temperature sensor circuit 318. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuitry 310 includes buffers such as registers, ROM fuses and other storage devices for storing default values such as base voltages and other parameters. Temperature sensor circuit 318 detects current temperature at memory die 300.

The on-chip address decoder 314 provides an address interface between addresses used by controller 120 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, read/write circuits 328 and decoders 324/332 comprise one embodiment of a control circuit for memory structure 326. In other embodiments, other circuits that support and operate on memory structure 326 can be referred to as a control circuit. For example, in some embodiments, the controller can operate as the control circuit or can be part of the control circuit.

In one embodiment, memory structure 326 comprises a three dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. A NAND string includes memory cells connected by a channel.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
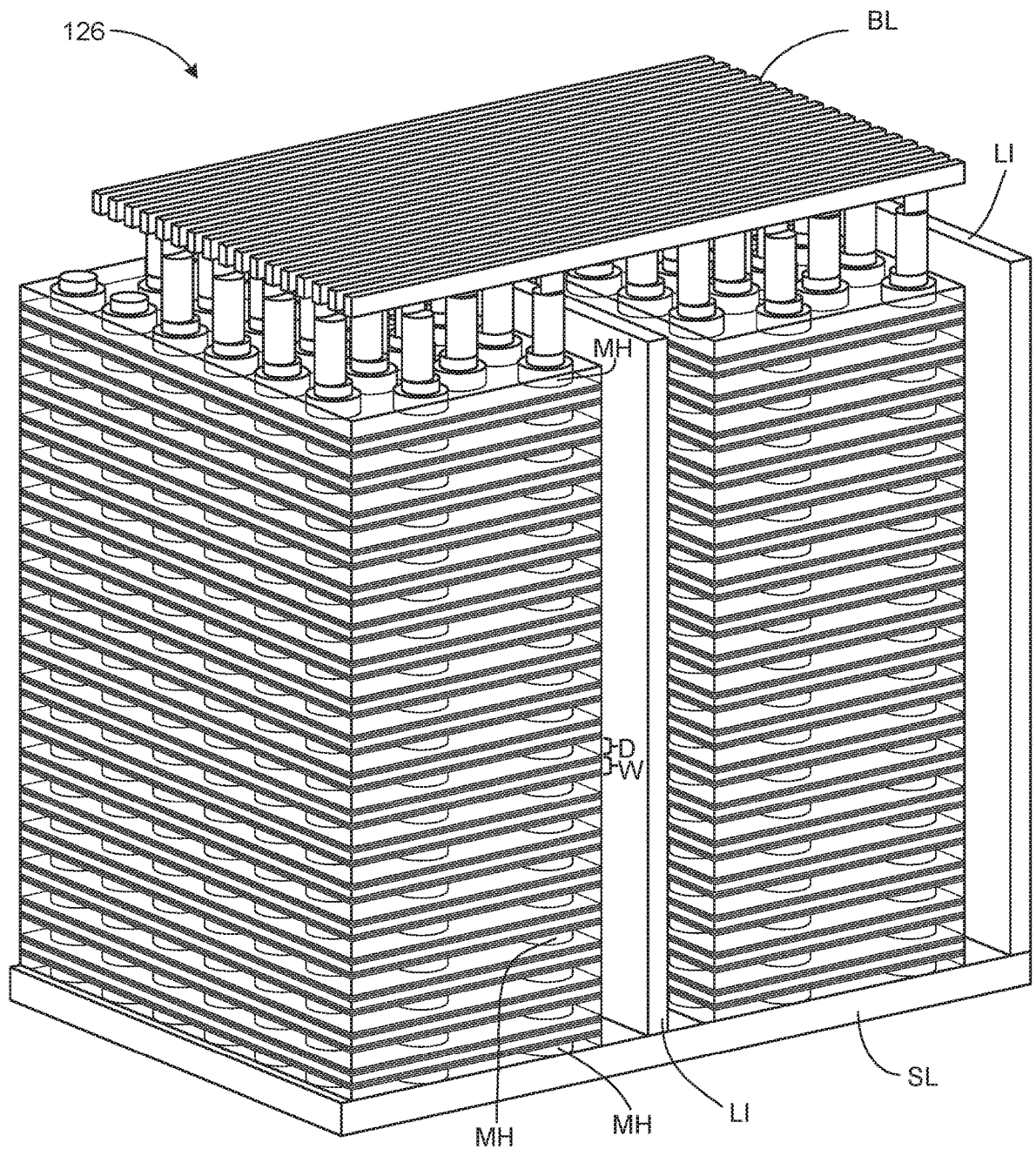
FIG. 3 is a perspective view of a portion of one embodiment of a monolithic three dimensional memory structure.

FIG. 3 is a perspective view of a portion of one example embodiment of a monolithic three dimensional memory array that can comprise memory structure 326, which includes a plurality non-volatile memory cells. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. As will be explained below, the alternating dielectric layers and conductive layers are divided into four "fingers" by local interconnects L1. FIG. 3 shows two fingers and two local interconnects L1. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 126 is provided below with respect to FIG. 4A-4G.

FIG. 4A is a block diagram explaining one example organization of memory structure 326, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits. In some embodiments, a block represents a groups of connected memory cells as the memory cells of a block share a common set of word lines.

Figure 4B:
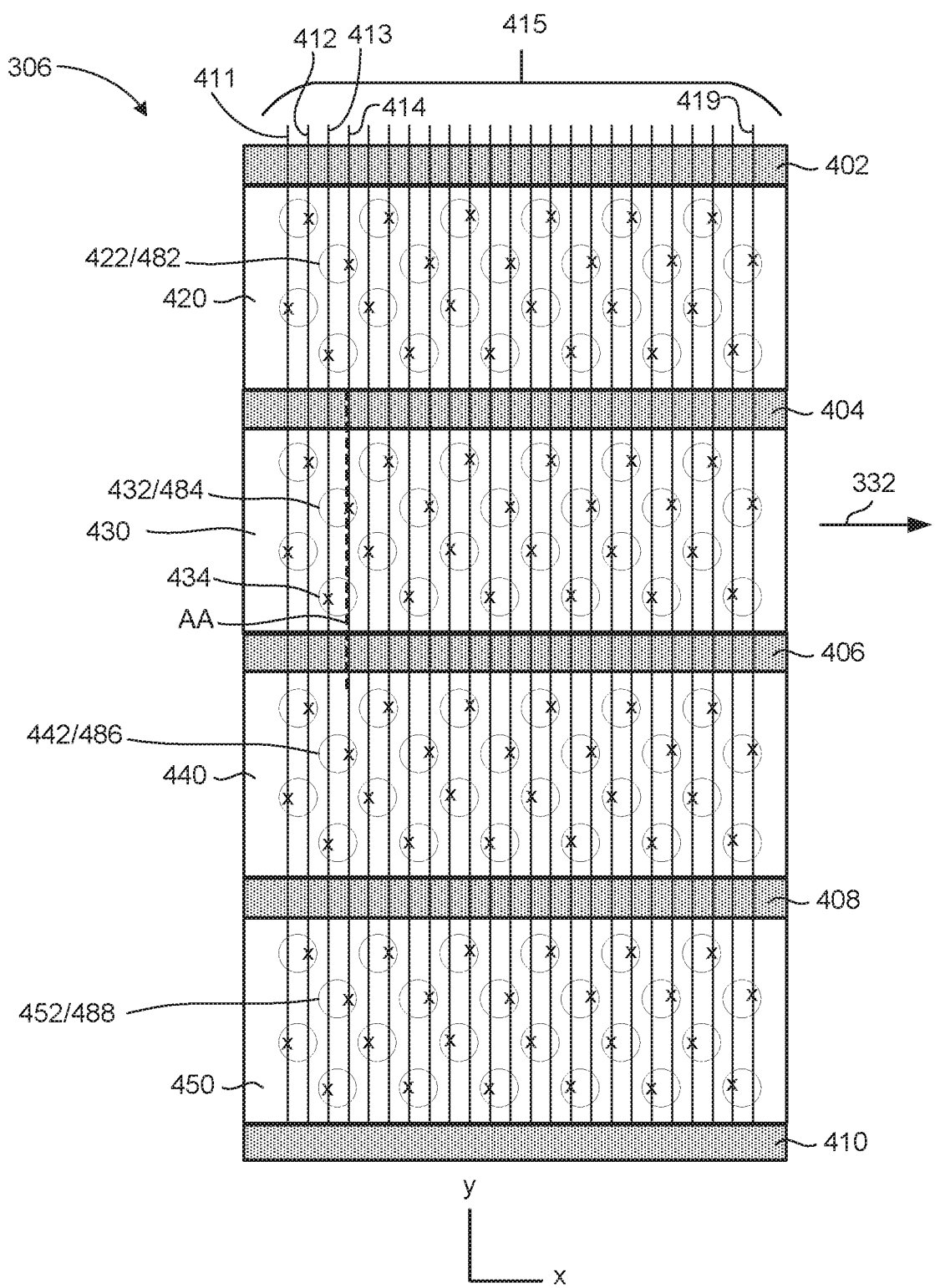
FIG. 4B depicts a top view of a portion of a block of memory cells.

FIGS. 4B-4G depict an example three dimensional ("3D") NAND structure that corresponds to the structure of FIG. 3 and can be used to implement memory structure 326 of FIG. 2. FIG. 4B is a block diagram depicting a top view of a portion of one block from memory structure 326. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332 and in the direction of arrow 332, the block includes more vertical columns than depicted in FIG. 4B FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
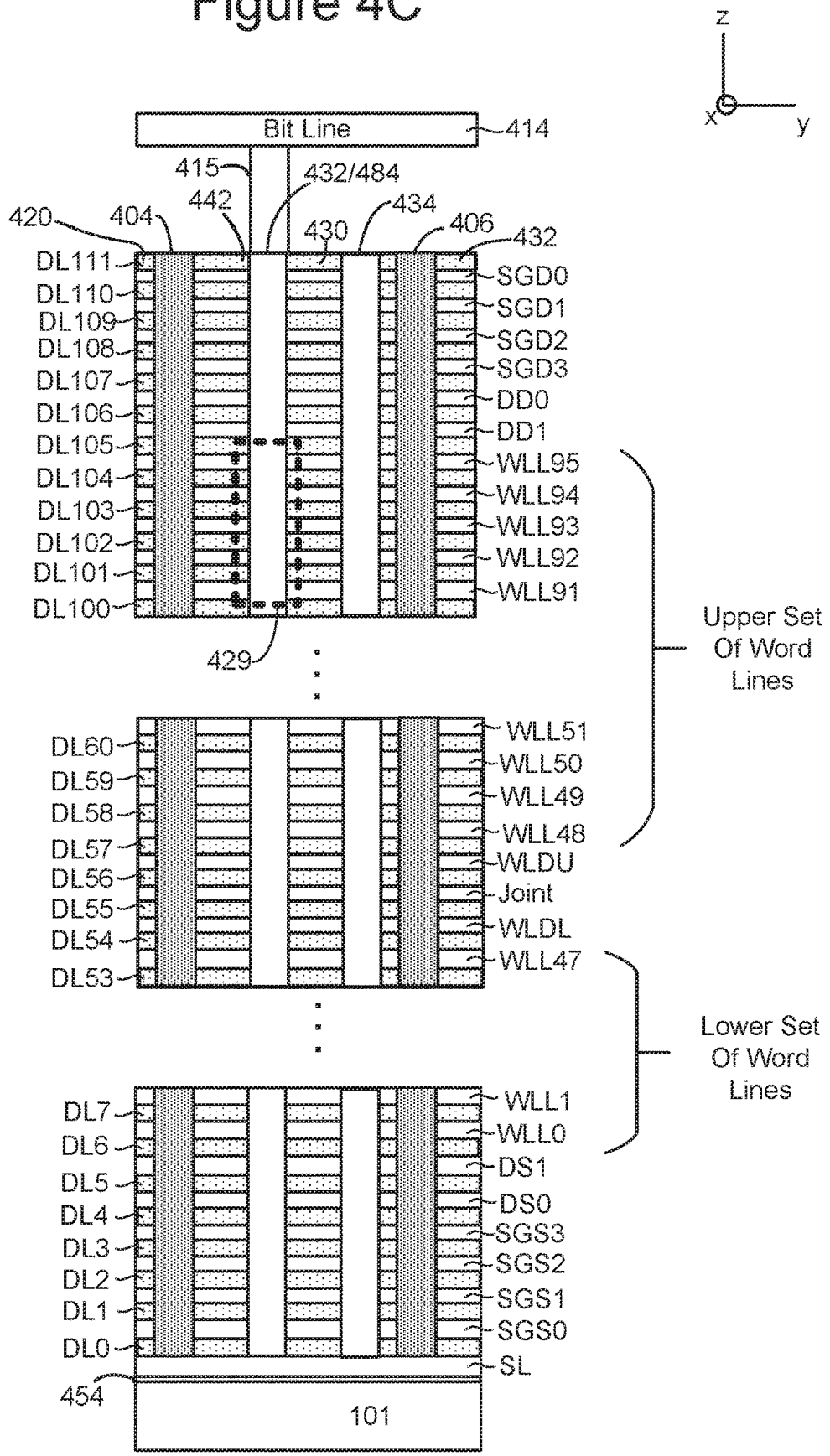
FIG. 4C depicts a cross sectional view of a portion of a block of memory cells.

FIG. 4C depicts a portion of one embodiment of a three dimensional memory structure 326 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; six dummy word line layers DD0, DD1, DS0, DS1, WLDL, WLDU; and ninety six data word line layers WLL0-WLL95 for connecting to data memory cells. Other embodiments can implement more or less than four drain side select layers, more or less than four source side select layers, more or less than six dummy word line layers, and more or less than ninety six word lines. Vertical columns 432 and 434 are depicted protruding through the drain side select layers, source side select layers, dummy word line layers and word line layers. In one embodiment, each vertical column comprises a vertical NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0, DS1, WLDL and WLDU; and word line layers WLL0-WLL95 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL111. For example, dielectric layers DL104 is above word line layer WLL94 and below word line layer WLL95. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WLL0-WLL95 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a Joint area. In one embodiment it is expensive and/or challenging to etch ninety six word line layers intermixed with dielectric layers. To ease this burden, one embodiment includes laying down a first stack of forty eight word line layers alternating with dielectric layers, laying down the Joint area, and laying down a second stack of forty eight word line layers alternating with dielectric layers. The Joint area is positioned between the first stack and the second stack. The Joint area is used to connect to the first stack to the second stack. In FIG. 4C, the first stack is labeled as the "Lower Set of Word Lines" and the second stack is labeled as the "Upper Set of Word Lines." In one embodiment, the Joint area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

Figure 4D:
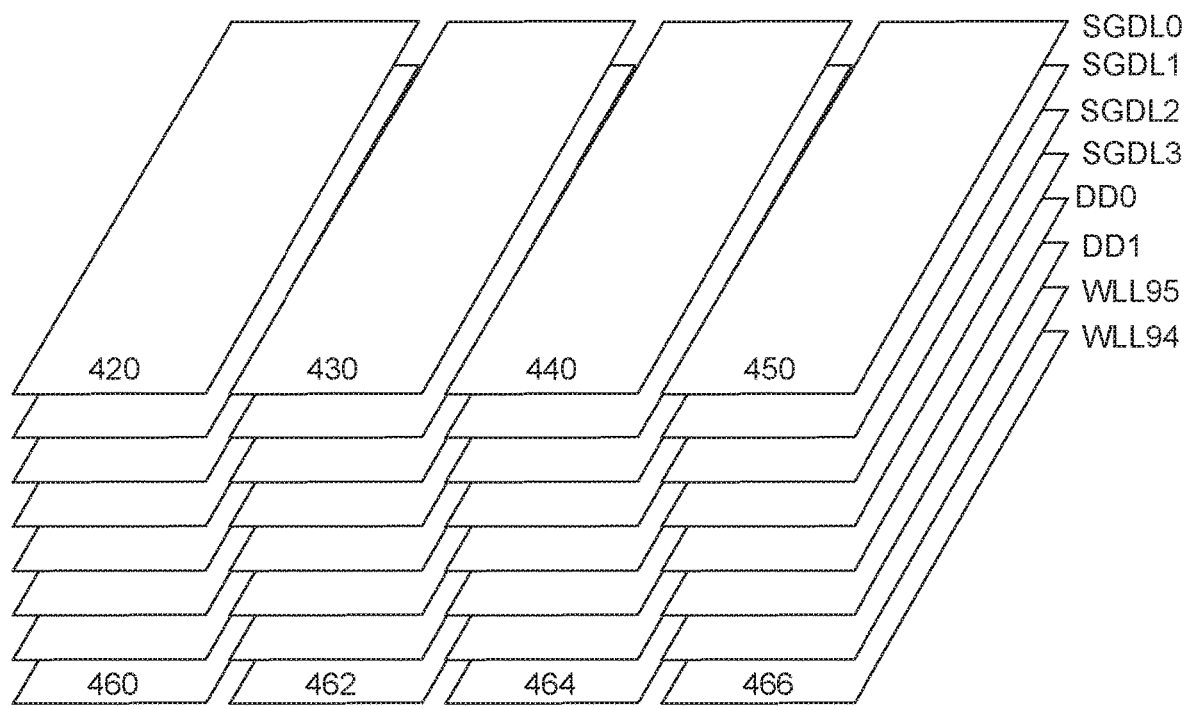
FIG. 4D depicts a view of the select gate layers and word line layers.
Figure 4D:
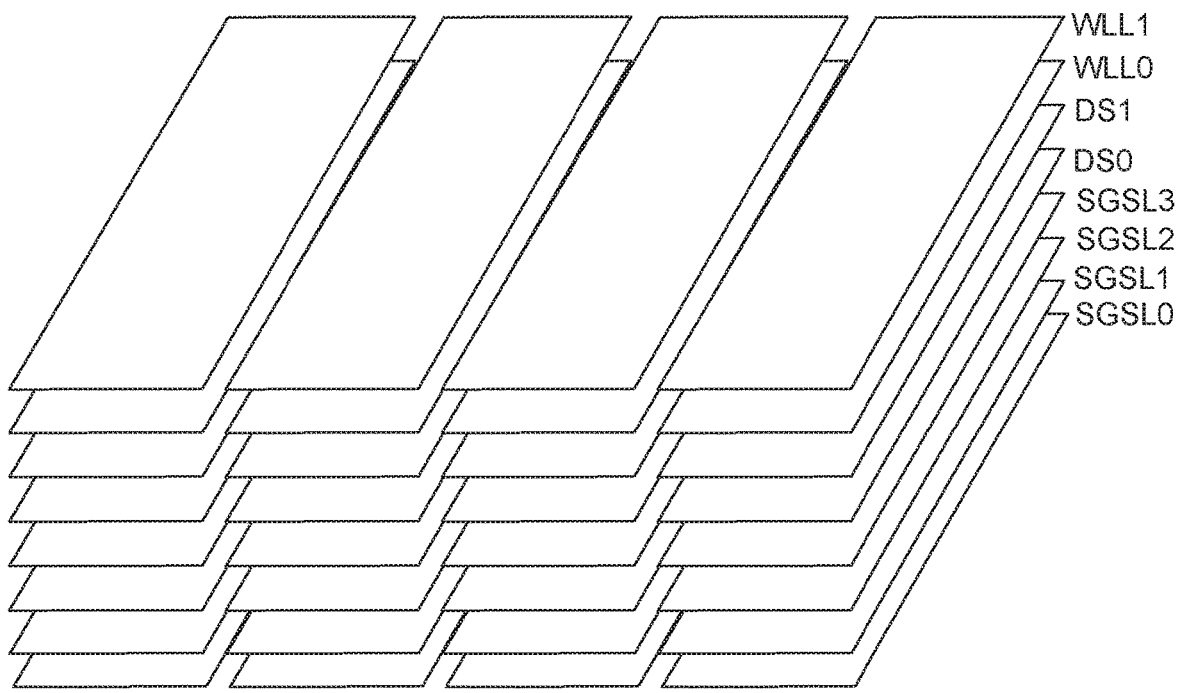

FIG. 4D depicts a logical representation of the conductive layers (SGD0, SGD1, SGD2, SGD3, SGS0, SGS1, SGS2, SGS3, DD0, DD1, DS0, DS1, and WLL0-WLL95) for the block that is partially depicted in FIG. 4C. As mentioned above with respect to FIG. 4B, in one embodiment local interconnects 402, 404, 406, 408 and 410 break up the conductive layers into four regions/fingers (or sub-blocks). For example, word line layer WLL94 is divided into regions 460, 462, 464 and 466. For word line layers (WLL0-WLL127), the regions are referred to as word line fingers; for example, word line layer WLL126 is divided into word line fingers 460, 462, 464 and 466. For example, region 460 is one word line finger on one word line layer. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
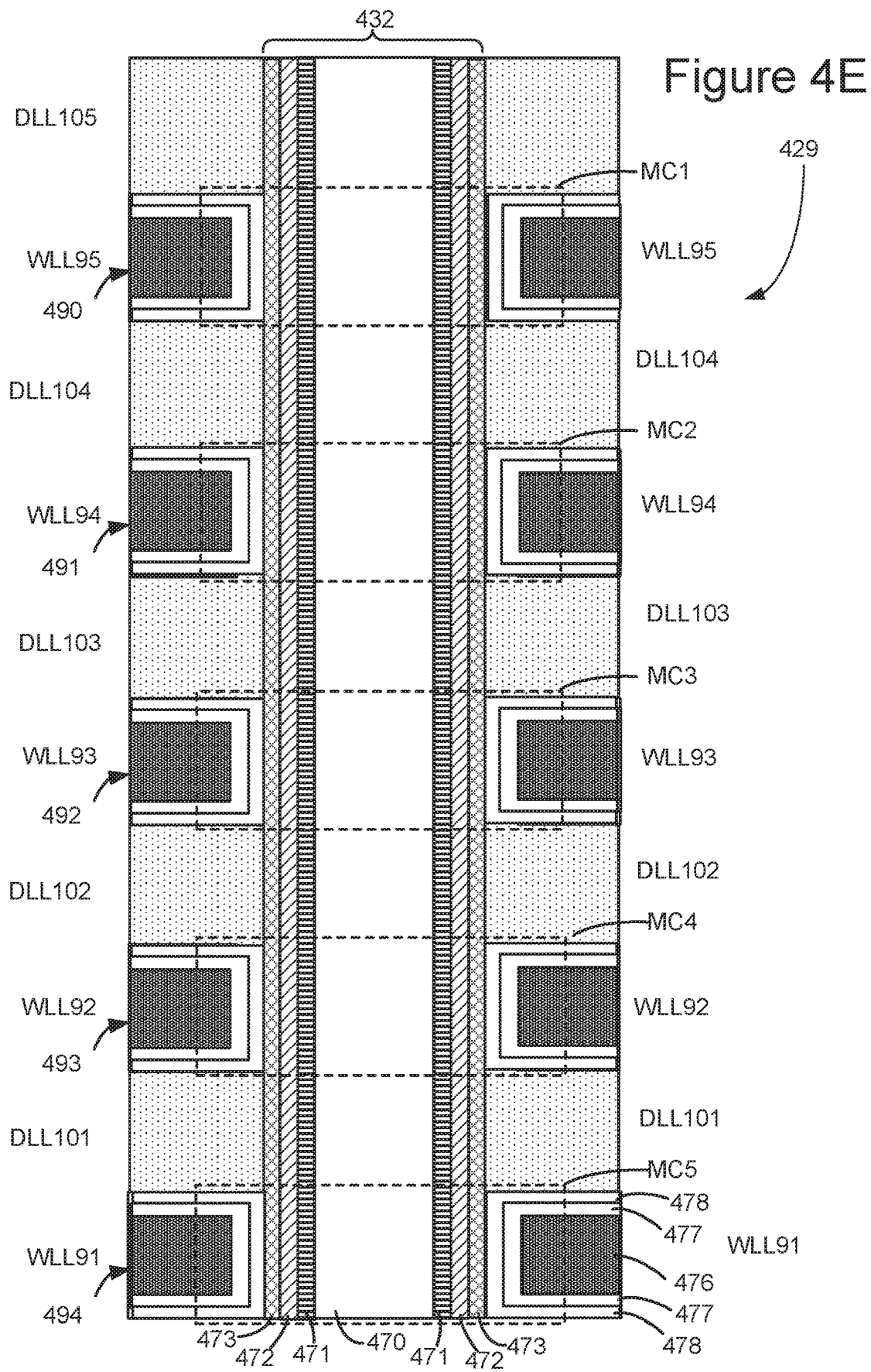
FIG. 4E is a cross sectional view of a vertical column of memory cells.

FIG. 4E depicts a cross sectional view of region 429 of FIG. 4C that includes a portion of vertical column 432 (a memory hole). In one embodiment, the vertical columns are round; however, in other embodiments other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line and the source line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL105, DLL104, DLL103, DLL102 and DLL101, as well as word line layers WLL95, WLL94, WLL93, WLL92, and WLL91. Each of the word line layers includes a word line region 476 surrounded by an aluminum oxide layer 477, which is surrounded by a blocking oxide (Sift) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL95 and a portion of vertical column 432 comprise a memory cell MC1. Word line layer WLL94 and a portion of vertical column 432 comprise a memory cell MC2. Word line layer WLL93 and a portion of vertical column 432 comprise a memory cell MC3. Word line layer WLL92 and a portion of vertical column 432 comprise a memory cell MC4. Word line layer WLL91 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
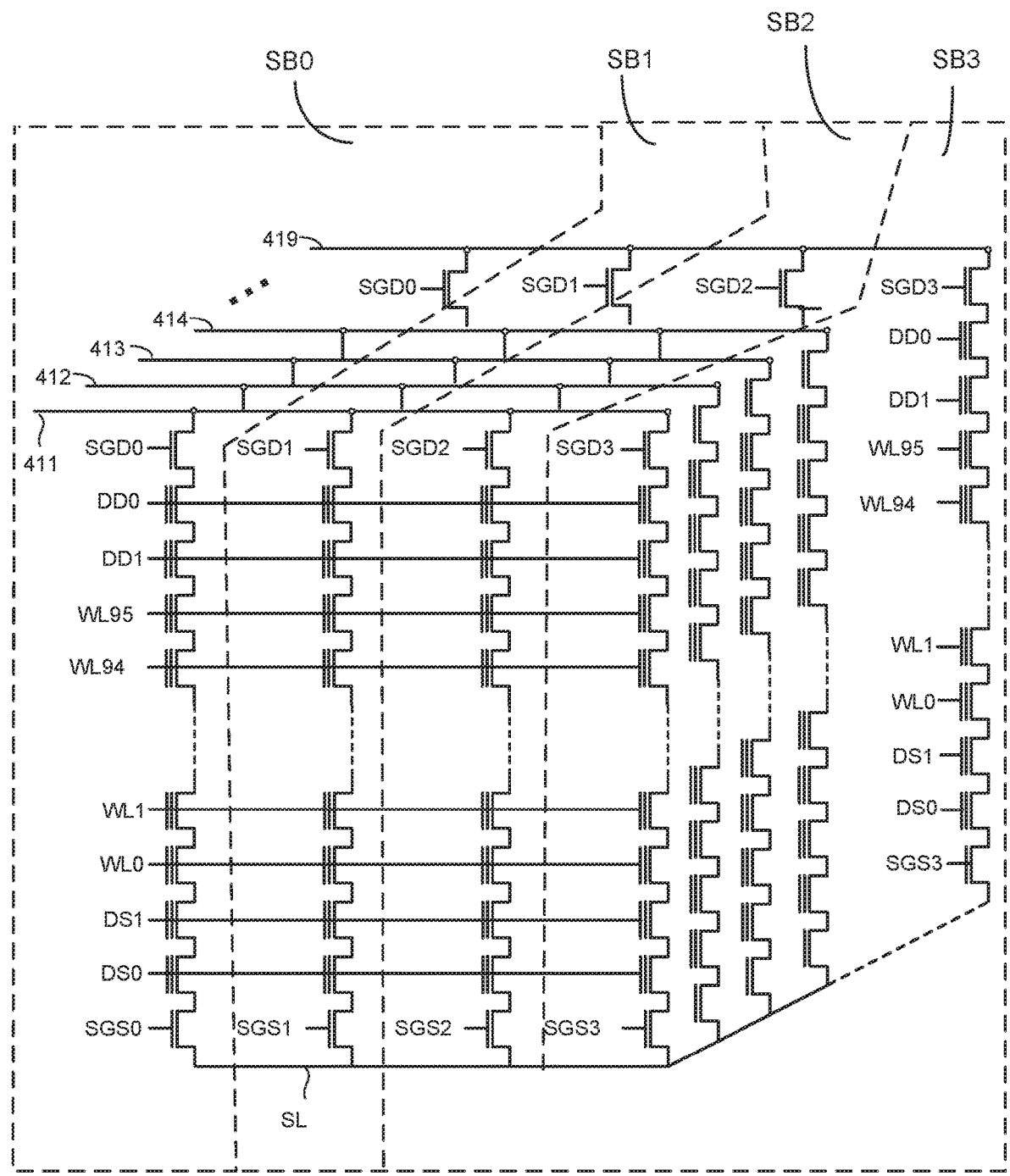
FIG. 4F is a schematic of a plurality of NAND strings showing multiple sub-blocks.

FIG. 4F is a schematic diagram of a portion of the memory depicted in in FIGS. 3-4E. FIG. 4F shows physical word lines WLL0-WLL95 running across the entire block. The structure of FIG. 4F corresponds to portion 306 in Block 2 of FIGS. 4A-E, including bit lines 411, 412, 413, 414, . . . 419. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Figure 4G:
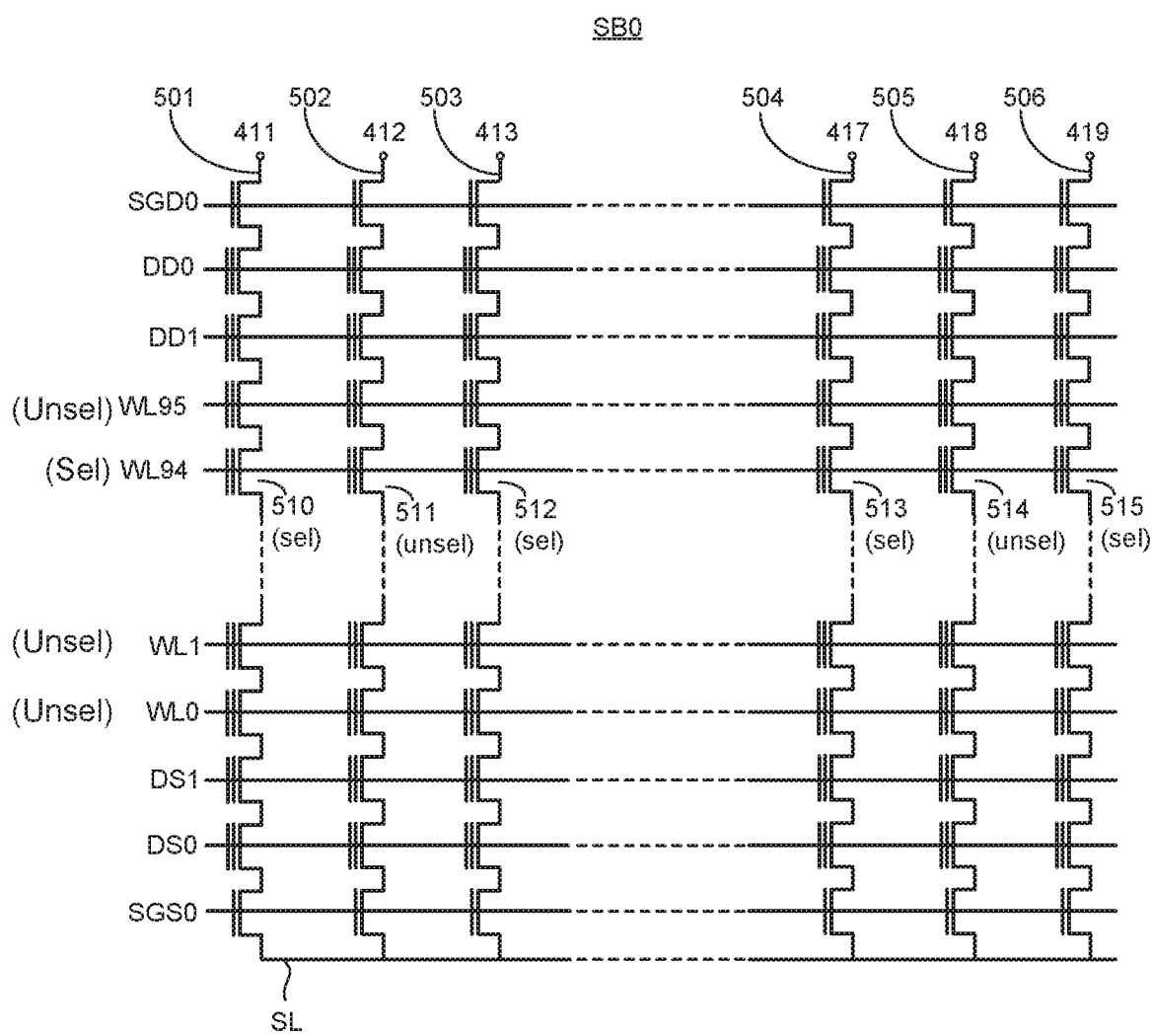
FIG. 4G is a schematic of a plurality of NAND strings showing one sub-block.

FIG. 4G is a schematic of sub-block SB0. Sub-blocks SB1, SB2 and SB3 have similar structures. FIG. 4G shows physical word lines WL0-WL95 running across the entire sub-block S0. All of the NAND strings of sub-block S0 are connected to SGD0 and SGS0. FIG. 4G only depicts six NAND stings 501, 502, 503, 504, 505 and 506; however, sub-block SB0 will have thousands of NAND strings (e.g., 15,000 or more).

FIG. 4G is being used to explain the concept of a selected memory cell. A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

As an example of selected memory cells and unselected memory cells, during a programming process, the set of memory cells intended to take on a new electrical characteristic (or other characteristic) to reflect a changed programming state are referred to as the selected memory cells while the memory cells that are not intended to take on a new electrical characteristic (or other characteristic) to reflect a changed programming state are referred to as the unselected memory cells. In certain situations, unselected memory cells may be connected to the same word line as selected memory cells. Unselected memory cells may also be connected to different word lines than selected memory cells. Similarly, during a reading process, the set of memory cells to be read are referred to as the selected memory cells while the memory cells that are not intended to be read are referred to as the unselected memory cells.

To better understand the concept of selected memory cells and unselected memory cells, assume a programming operation is to be performed and, for example purposes only, that word line WL94 and sub-block S0 are selected for programming (see FIG. 4G). That means that all of the memory cells connected to WL94 that are in sub-blocks SB1, SB2 and SB3 (the other sub-blocks) are unselected memory cells. Some of the memory cells connected to WL94 in sub-block S0 are selected memory cells and some of the memory cells connected to WL94 in sub-block S0 are unselected memory cells depending on how the programming operation is performed and the data pattern being programmed. For example, those memory cells that are to remain in the erased state S0 will be unselected memory cells, because their programming state will not change in order to store the desired data pattern, while those memory cells that are intended to take on a new electrical characteristic (or other characteristic) to reflect a changed programming state (e.g., programmed to states S1-S7) are selected memory cells. Looking at FIG. 4G, assume for example purposes, that memory cells 511 and 514 (which are connected to word line WL94) are to remain in the erased state; therefore, memory cells 511 and 514 are unselected memory cells (labeled unsel in FIG. 4G). Additionally, assume for example purposes that memory cells 510, 512, 513 and 515 (which are connected to word line WL94) are to be programmed to any of the data states S1-S7; therefore, memory cells 510, 512, 513 and 515 are selected memory cells (labeled sel in FIG. 4G).

Although the example memory system of FIGS. 3-4G is a three dimensional memory structure that includes vertical NAND strings with charge-trapping material, other (2D and 3D) memory structures can also be used with the technology described herein.

Figures 5, 6:
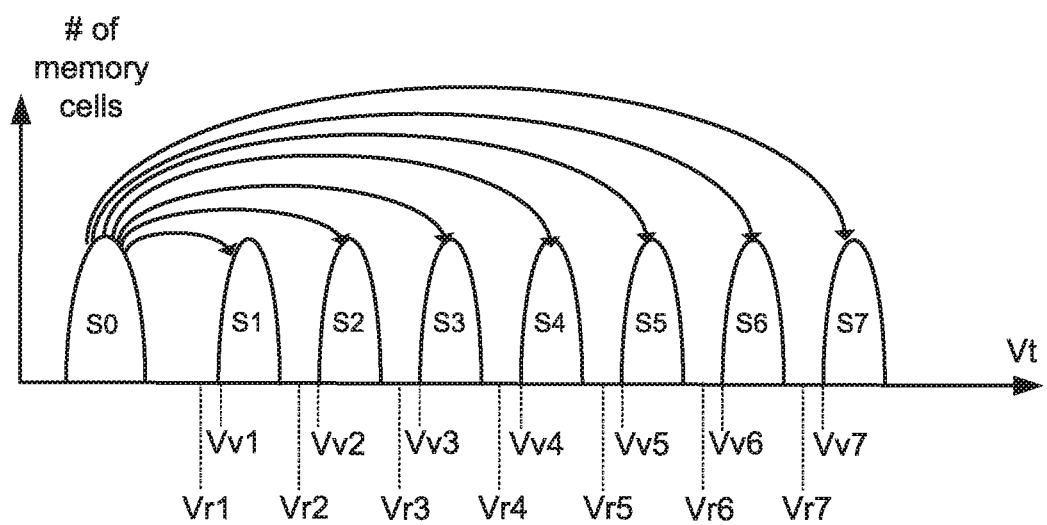
FIG. 5 depicts threshold voltage distributions.
FIG. 6 is a table describing one example of an assignment of data values to data states.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7. FIG. 5 also shows Vev, which is a voltage level to test whether a memory cell has been properly erased.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming). In some embodiments, data states S1-S7 can overlap, with controller 120 relying on error correction to identify the correct data being stored.

FIG. 6 is a table describing one example of an assignment of data values to data states. In the table of FIG. 6, S0=111, S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state. In the embodiment of FIG. 6, all bits stored in a memory cell are 1 when the memory cells are erased (e.g., in data state S0).

Figure 7:
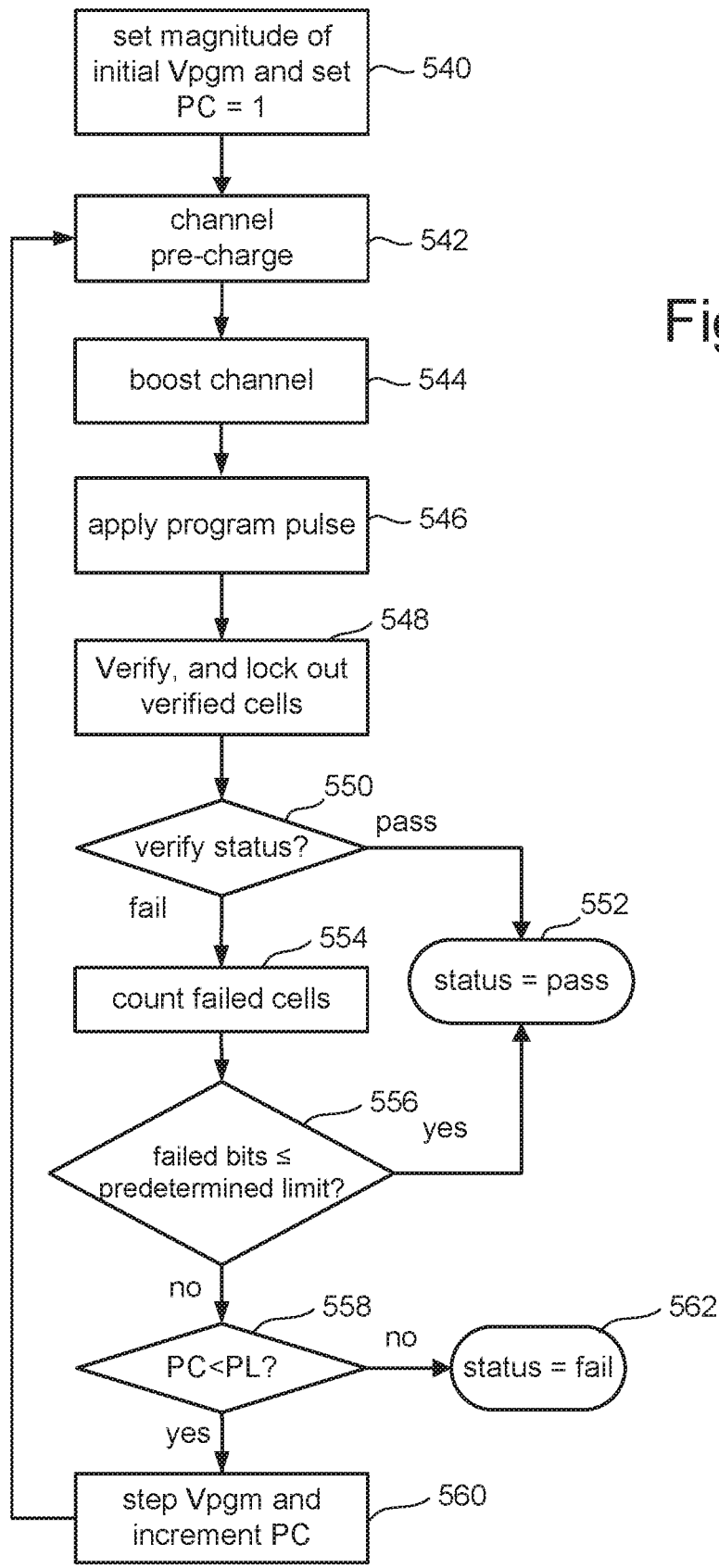
FIG. 7 is a flow chart describing one embodiment of a process for programming non-volatile memory.

FIG. 7 is a flowchart describing one embodiment of a process for programming. In one example embodiment, the process of FIG. 7 is performed on memory die 300 using the control circuit discussed above. For example, the process of FIG. 7 can be performed at the direction of state machine 312. The process of FIG. 7 can also be used to implement the full sequence programming discussed above. Additionally, the process of can be used to implement each phase of a multi-phase programming process.

Typically, the program voltage applied to the control gates (via a selected word line) during a program operation is applied as a series of program pulses. Between programming pulses are a set of verify pulses to perform verification.

In many implementations, the magnitude of the program pulses is increased with each successive pulse by a predetermined step size. In step 540 of FIG. 7, the programming voltage (Vpgm) is initialized to the starting magnitude (e.g., ~12-16V or another suitable level) and a program counter PC maintained by state machine 312 is initialized at 1.

In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. For example, when data is written to a set of memory cells, some of the memory cells will need to store data associated with state S0 so they will not be programmed. Additionally, as memory cells reach their intended target data state, they will be inhibited from further programming. Those NAND strings that include memory cells connected to the selected word line that are to be inhibited from programming have their channel's voltage raised, or boosted, to inhibit programming. When a channel has a boosted voltage, the voltage differential between the channel and the word line is not large enough to cause programming.

To assist in boosting, in step 542 the memory system will pre-charge channels of NAND strings that include memory cells connected to the selected word line that are to be inhibited from programming. In some embodiments, only the drain side of the channel is pre-charged. By "drain side" it is meant the portion of the NAND string on the drain side of the selected word line. In other embodiment, the entire channel of the NAND string is pre-charged or some other portion of the channel is pre-charged. As used herein, to pre-charge a NAND string, and more particularly a programming pre-charge, is an operation or phase in a programming algorithm to help establish the wanted bias conditions on the portion of a memory array involved in the program operation. Prior to applying a programming pulse, the NAND strings that have a memory cell that is to be programmed are biased to voltage levels to enable and encourage the programming of the selected memory cells. For NAND strings that are connected along a selected word line, but which are currently non-selected for programming, the NAND string is biased in a way to avoid or inhibit programming, that would result in a program disturb that causes a non-selected memory cell to change its voltage threshold. The programming pre-charge helps to establish these conditions, in addition to, or instead of, a subsequent boosting of the channel in step 544.

As used herein, a pre-charge for a programming operation is a sub-operation or phase of a programming operation performed prior to applying a programming pulse to a selected word line and is used to help establish bias conditions on memory cells and NAND strings connected to the program selected word line. In embodiments describe here, the pre-charge is used to raise the channel voltage of non-selected NAND strings, by placing the memory cells and select gates between the selected word line and the corresponding bit line to an on state, allowing the NAND string to be biased according to the level on their corresponding bit lines of either a program enable voltage or program inhibit voltage, as discussed more below. Depending on the embodiment, the selected memory cell may be biased to be off, so that only the drain side of the channel is pre-charged, or the selected memory cell and non-selected memory cells on the source side may be on, to pre-charge the whole of the channel. In the following examples, only the drain side is actively pre-charged.

In step 544, NAND strings that include memory cells connected to the selected word line that are to be inhibited from programming have their channels raised or boosted to inhibit programming. In one embodiment, the unselected word lines receive one or more boosting voltages (e.g., ~7-11 volts) to perform boosting schemes known in the art. For NAND strings that include memory cells connected to the selected word line that are to be programmed, these selected NAND strings will have their channels kept low to enable programming. In one embodiment, the selected NAND strings will have their channels set to a program enable voltage at or near ground (0 volts) to facilitate programming. As used herein, a program enable voltage is a voltage selected to set the channel region of selected memory cells to a low enough voltage level so that when the program pulse is applied to the selected word line, a sufficient voltage differential is generated between the channel and the control gate of a selected memory cell to induce electron injection into the selected memory cell's charge storing region. The pre-charge phase of step 542 and subsequent channel boosting and program pulse of steps 544 and 546 are considered further below, with additional detail for step 542 given in FIG. 13.

In step 546, a program pulse of the program signal Vpgm is applied to the selected word line (the word line selected for programming). If a memory cell should be programmed, then the corresponding bit line is grounded. On the other hand, if the memory cell should remain at its current threshold voltage, then the corresponding bit line is connected to a program inhibit voltage to inhibit programming. As used herein, a program inhibit voltage is a voltage selected to raise the voltage level within the channel region of non-selected memory cells to a high enough voltage level so that when the program pulse is applied to the selected word line, any voltage differential generated between the channel and the control gate of a non-selected memory cell is insufficient to induce electron injection into the non-selected memory cell's charge storing region. For example, in embodiments described here a non-selected NAND string may have its corresponding bit lines biased to a program inhibit level of around 2.5V, for example, where this value can vary from around 1.5V to 3.5V or even higher depending on the embodiment.

In step 546, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 548, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage.

In step 550, it is determined whether all the memory cells have reached their target threshold voltages (pass). If so, the programming process is complete and successful because all selected memory cells were programmed and verified to their target states. A status of "PASS" is reported in step 552.

If, in step 550, it is determined that not all of the memory cells have reached their target threshold voltages (fail), then the programming process continues to step 554.

In step 554, the memory system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 556, it is determined whether the count from step 554 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 552. In this situation, enough memory cells programmed correctly such that the few remaining memory cells that have not been completely programmed can be corrected using ECC during the read process. In some embodiments, the predetermined limit used in step 556 is below the number of bits that can be corrected by error correction codes (ECC) during a read process to allows for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 558 and the program counter PC is checked against the program limit value (PL). Examples of program limit values include 6, 12, 16, 20 and 30; however, other values can be used. If the program counter PC is not less than the program limit value PL, then the program process is considered to have failed and a status of FAIL is reported in step 562. If the program counter PC is less than the program limit value PL, then the process continues at step 560 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 560, the process loops back to step 542 and another program pulse is applied to the selected word line so that another iteration (steps 542-560) of the programming process of FIG. 7 is performed.

In general, during verify operations and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 5) or verify operation (e.g. see verify target levels Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as a read bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 8:
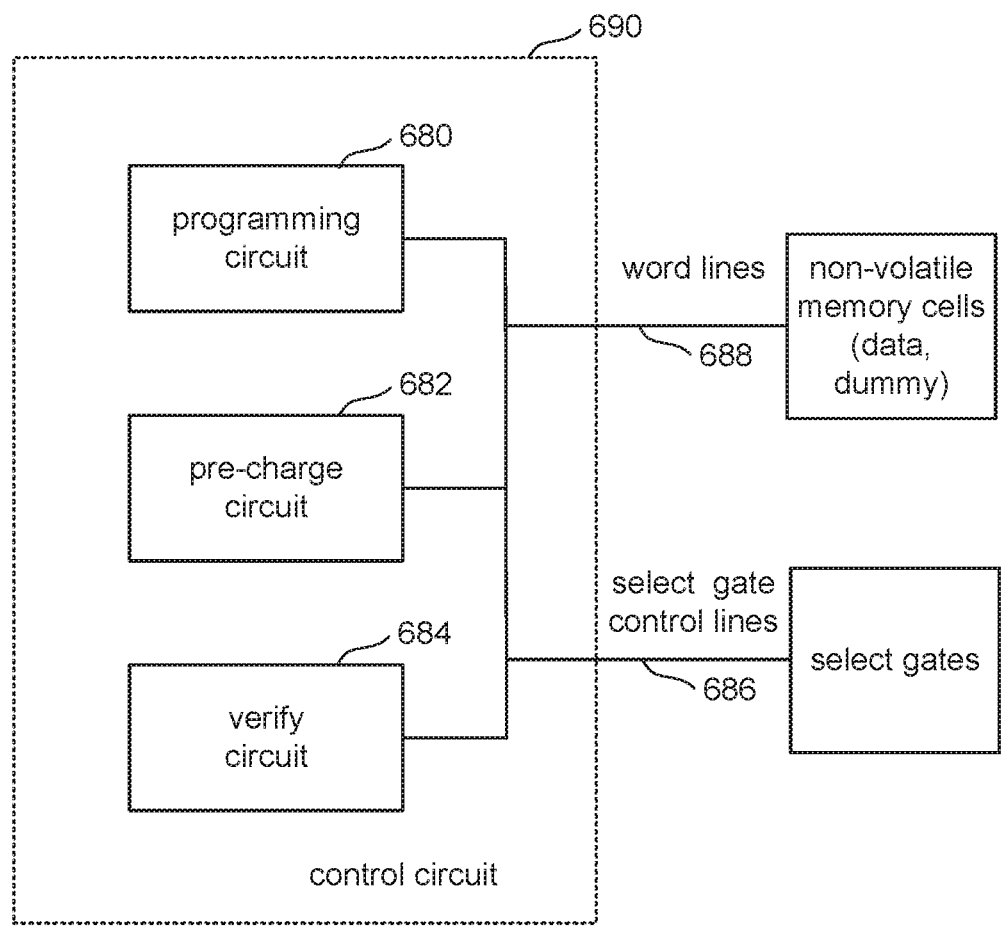
FIG. 8 is a logical block diagram depicting one embodiment of various circuits used to perform the processes described herein.

FIG. 8 is a logical block diagram depicting various electrical circuits that can be used to perform the processes of FIGS. 9, 10, 11A, 11B, 12A and 12B and that can implement the proposal discussed herein to pre-charge NAND strings along a word line selected for programming. In one embodiment, all of the circuits depicted in FIG. 8 are resident on the memory die 300. In other embodiments, one or more of the circuits are located off the memory die, such as (for example) on controller 120 or elsewhere. FIG. 8 shows programming circuit (or write circuit) 680, pre-charge circuit 682 and verify circuit 684 all connected to word lines 688 and select gate control lines 686. Word lines 688, which correspond to WL0-WL95 and dummy word lines DD0, DD1, DS0 and DS1 discussed above, are connected to data and dummy non-volatile memory cells of memory structure 326. Select gate control lines 686, which correspond to SGD0-SGD3 and SGS0-SGS3 discussed above, are connected to select gates of memory structure 326. Therefore, circuits 680-684 are connected to the non-volatile memory cells and select gates of memory structure 326. In one embodiment, memory structure 326 comprises a plurality of non-volatile memory cells, a plurality of select gates, and a plurality of channels that are each connected to memory cells and a select gate.

Figure 10:
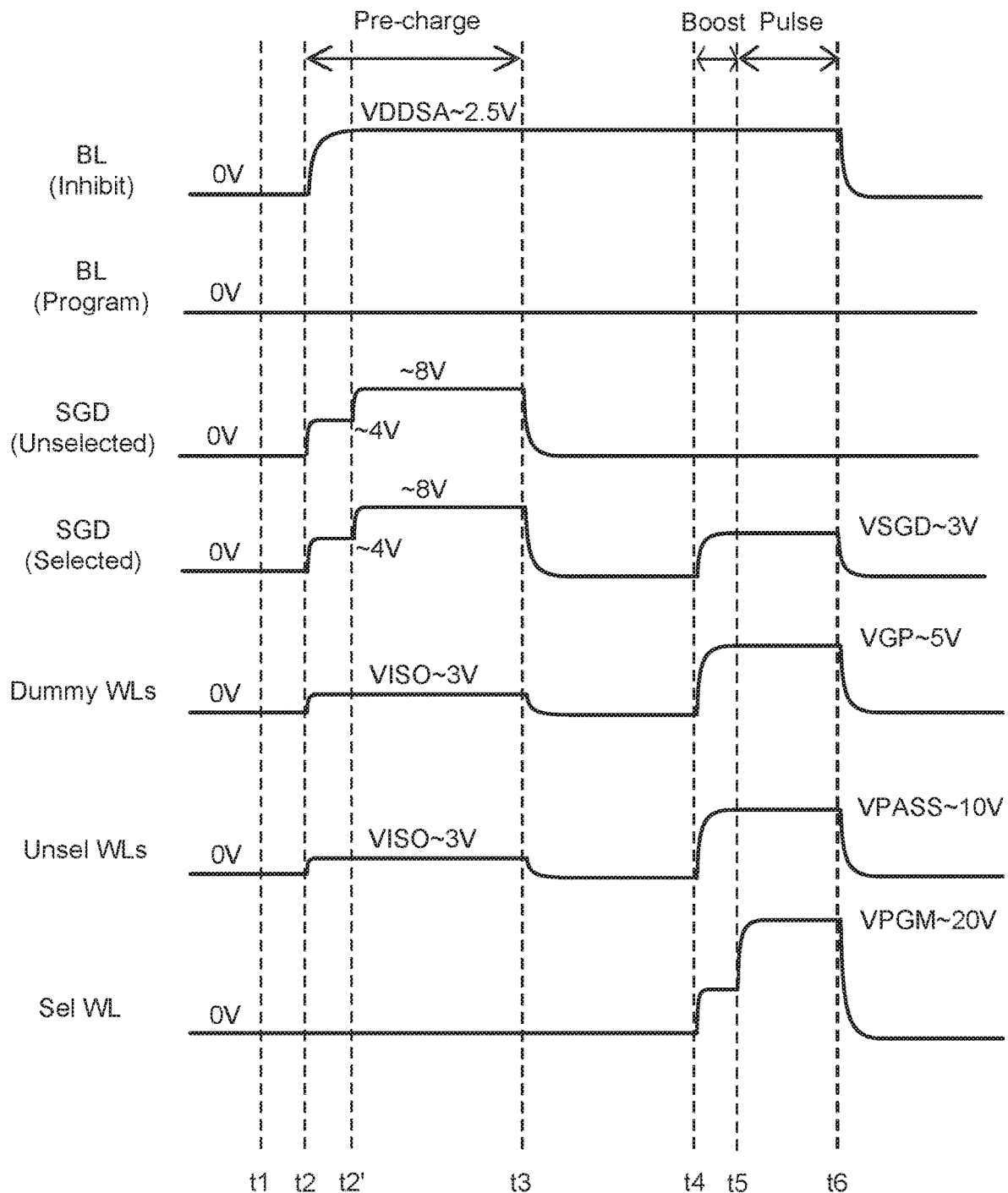
FIGS. 10, 11A, and 12A illustrate several embodiments for waveforms that can be used in the pre-charge and pulse phases for the flow of FIG. 7 in order to reduce disturb of a select gate in pre-charge phase of a program operation.
Figure 11A:
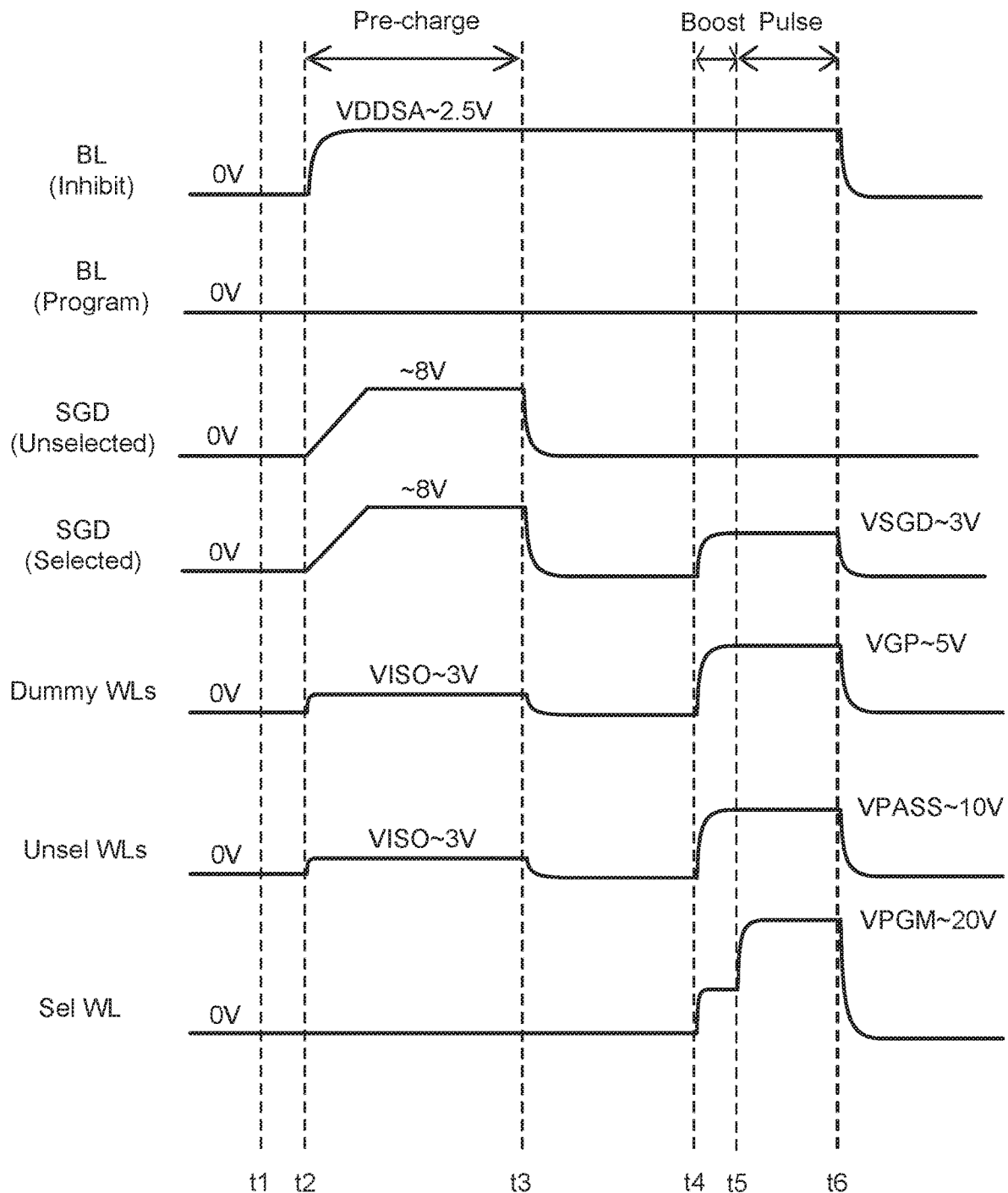
Figure 12A:
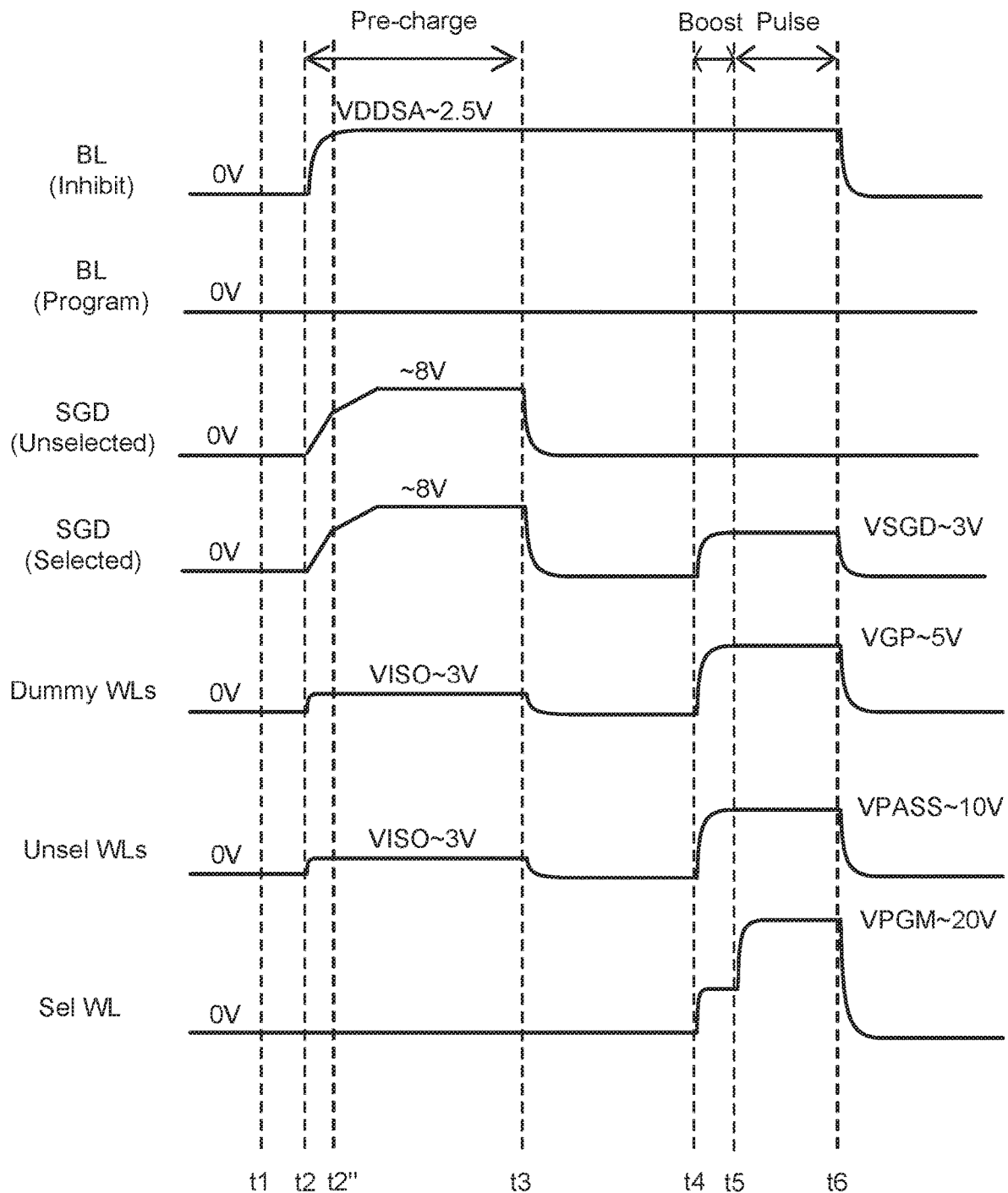

In one embodiment, programming circuit (or write circuit) 680, pre-charge circuit 682 and verify circuit 684 together form control circuit 690, which can be part of control circuitry 310 (e.g., state machine 312) or controller 120. In one embodiment, circuits 680-684 are part of state machine 312 (or a microcontroller). Programming circuit 680 performs programming (writing) on the non-volatile memory cells of memory structure 326, including applying the program pulse in step 546 and performing steps 540 and 558-562 of FIG. 7 in order to program selected memory cells during the programming process. More specifically, the programming circuit 680 can apply the programming pulse to the selected one of the word lines 688, while biasing the non-selected word lines and dummy word lines of 688 at their correspond programming pass voltages. The programming circuit 680 can also bias the select gate control lines 686 to their corresponding selected and unselected values as illustrated in the embodiments of FIG. 10, 11A or 12A, for example.

As used herein, a pre-charge circuit refers to the circuit elements on the memory device used to establish and supply the various voltage levels applied to the selected and non-selected NAND strings connected along the selected word line during the pre-charge phase of step 542 of FIG. 7. With reference to the embodiment of FIG. 8, pre-charge circuit 682 performs the pre-charging of the channels of unselected NAND strings, including applying the pre-charge signals described above with respect to step 542 of FIG. 7 and during the interval t2-t3 in FIGS. 10, 11A, 11B, 12A and 12B. The pre-charge circuit biases an array of memory cells in anticipation of the subsequent programming pulse. More specifically, the pre-charge circuit 682 can bias selected ones of the word lines 688 to ground, while driving the non-selected ones (both dummy and non-selected data word lines) of word lines 688, including a word line adjacent to a select gate, to a non-selected voltage level (i.e., a non-selected pre-charge level, or program pre-charge bypass voltage level), such as is illustrated in the embodiments of FIG. 10, 11A or 12A, for example. The pre-charge circuit 682 can also drive select gate control lines with pre-charge waveforms of multiple steps, such as illustrated in the embodiments of FIG. 10, 11A or 12A.

The pre-charge circuit 682 includes the various power supplies, including voltage regulators and charge pumps, used to provide the voltage levels used and the various drivers, decoding circuits and other logic used apply these voltage levels to the selected elements. The elements for pre-charging the NAND strings can include controller 120, control circuitry 310, state machine 312 in combination with power control circuit 316, pre-charge circuit 682 or control circuit 690. These elements of pre-charge circuit 682 can be implemented by dedicated hardware (e.g., electrical circuit), a processor programmed by software, an FPGA, a state machine, a microcontroller or equivalent thereof, as well as voltage generators (e.g., charge pumps).

Verify circuit 684 performs the program verify process of steps 546-556 of FIG. 7, including managing the Sense Blocks 350 (see FIG. 2), as well as biasing the word lines 688 and select gate control lines 686 for the sensing of selected memory cells during the verify process.

Figure 9A:
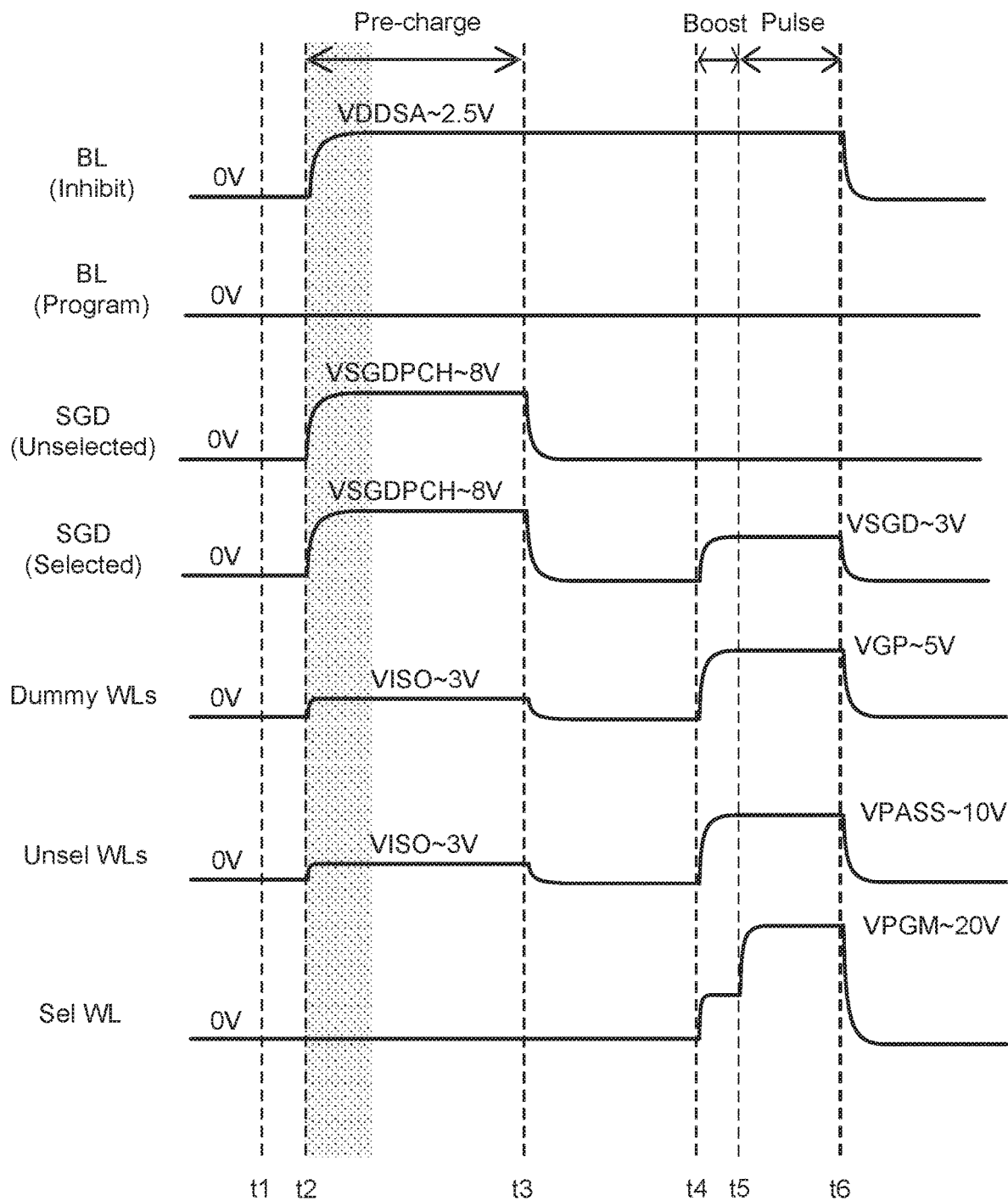
FIG. 9A is an example of some waveforms that can be used in the pre-charge and pulse phases for the flow of FIG. 7.
Figure 9B:
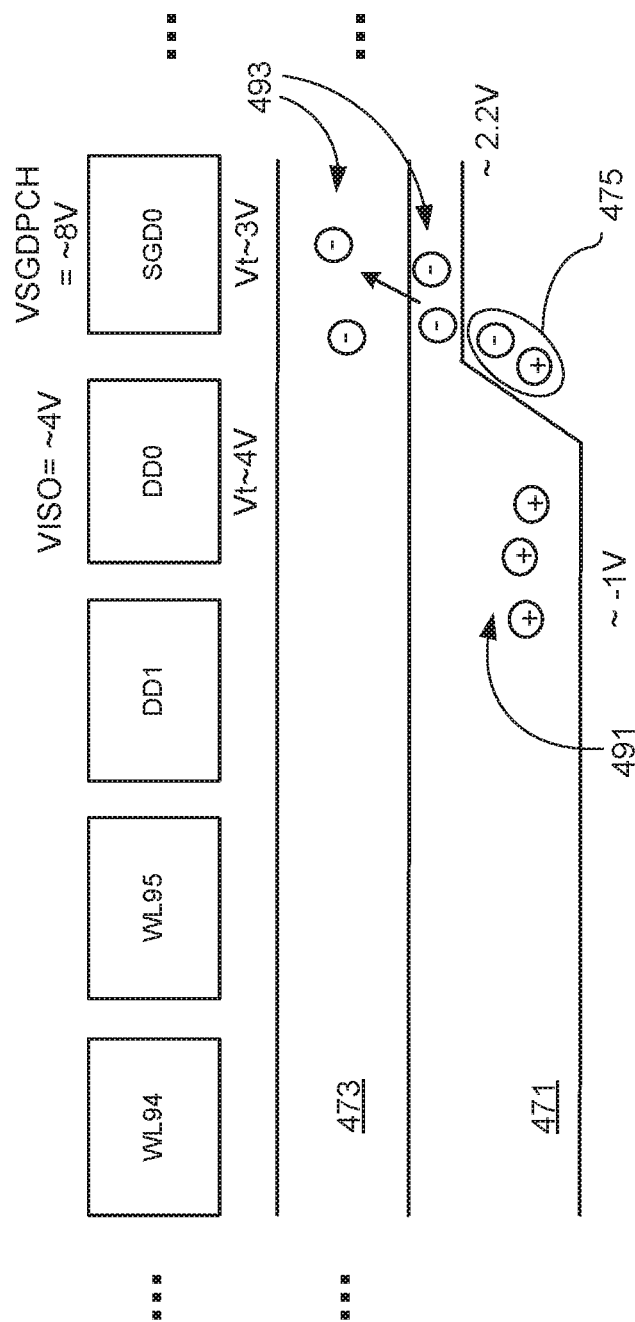
FIG. 9B illustrates a select gate disturb mechanism that can result from the waveforms of FIG. 9A.

FIG. 9A considers the pre-charge, boosting and pulse phases of steps 542, 544 and 546 in more detail by presenting a set of waveforms for one example of a program operation. FIG. 9B illustrates how these waveforms can lead to a disturb during the pre-charge operation. Program disturb is a condition that includes the unintended programming of one or more locations in a memory system while performing a programming process for other locations in the memory system. Such unintended programming can cause an error in the data being stored. In some cases, program disturb can result from electrons trapped in the channel being accelerated from the channel region of a dummy word line to the channel region of an adjacent select gate on the NAND string. Unlike a more typical disturb, which affects the threshold voltage of a memory cell and can result in an erroneous data state, the disturb of a select gate can raise the threshold voltage of a select gate, possibly affecting the sensing of all of the data memory cells of the corresponding NAND or even making the entire NAND string inaccessible.

FIG. 9A shows the waveforms applied to some of the control lines of a NAND memory array during the pre-charge and pulse phases of a write operation. The period t1 to t2 is a transition period between step 540 and 542 at the beginning of the process prior to the initial pulse or after the verify related steps in the previous programming loop. The period t2 to t3 corresponds to the pre-charge phase of step 542. The period t3 to t4 is the transition from the pre-charge step 542 and the subsequent channel boosting at step 544 and pulse at step 546. The channel boosting at t4 to t5 is followed by the pulse of step 546 that is applied during t5 to t6. The verify process of step 548 and the following steps of FIG. 7 follow after t6 and are not represented on FIG. 9A or other similar figures in the following discussion.

With respect to the specific waveforms represented in FIG. 9A, these are described with respect to an embodiment based on the NAND structure described above with respect to FIGS. 4A-4G. Under this arrangement, each block is subdivided into a number of sub-blocks or fingers (e.g., SB0-SB3 in FIG. 4F), where the memory cells of each layer of a given word line (whether a data word line or a dummy word line) are commonly connected on the same word line for all sub-blocks of a block. The select gates of each sub-block, however, can be individually biased (i.e., on the drain side of FIG. 4F, each of SGD0-SGD3 can be independently biased, and on the source side each of SGS0-SGS3 can be independently biased), but within each sub-block a given one of the select gates of each of NAND string share a common select gate control line (i.e., in FIG. 4G all of the select gates of SB0 are connected along the same control line SGS0). In a programming operation for an array having this structure, the memory cell to be programmed in each NAND string in a block will be on a word line that is selected for programming, and the NAND strings of a given block or sub-block are selected by setting the corresponding bit lines to a program enable voltage and setting the bit lines to the non-selected NAND strings to a program inhibit level. When a program selected memory cell verifies at its target data state, the corresponding bit line's level is switched from the program enable level to the program inhibit level to prevent the verified memory cell from further programming, as described above with respect to step 548 of FIG. 7. Having individually controllable select gates for each of the sub-blocks allows for selection and deselection at the sub-block level.

The top-most and second waveforms of FIG. 9A respectively correspond to the bit line levels of selected bit lines corresponding to non-selected NAND strings (BL (Inhibit)) and selected NAND strings (BL (Program)). The next two lines correspond to the select gate control line voltages applied to drain side select gates of non-selected sub-blocks (SGD (Unselected)) of a selected block and to drain side select gates of selected sub-blocks (SGD (Selected)) of a selected block. The Dummy WLs waveform is for the dummy word lines, such as DD0, DD1, DS0 and DS1 of FIG. 4F, for embodiments that include dummy word lines. The bottom two waveforms correspond to the unselected word lines (Unsel WL) and the selected word line (Sel WL) of the NAND structure.

During the transition period t1-t2, all of the levels are set to ground to stabilize the various control lines prior to the pre-charge phase. The pre-charge phase between t2 and t3, corresponding to step 542 in FIG. 7, is used to set the bias conditions on the NAND string for the subsequent programming pulse, raising the channel on the unselected NAND strings to a program inhibit level and biasing the channels of selected NAND strings at the program enable level, where these levels are supplied from the bit lines. More specifically, by turning on the drain side select gates and non-selected memory cells (both dummy and data memory cells), the voltage level of the channel region of the NAND strings (both selected and unselected) will be set by the voltage level on the NAND strings' corresponding bit lines. For the unselected NAND strings, the bit lines biased to a program inhibit level of VDDSA=~2.5V, for example, where this value can vary from around 1.5V to 3.5V or even higher depending on the embodiment. For a NAND string that is to be programmed, the corresponding bit lines are set to 0V, for example, or perhaps a few tenths of a volt higher, depending on the embodiment, in order to encourage programming when the programming pulse is subsequently applied.

To be able to set the channels at the appropriate level, the pre-charge circuit 682 drives the drain side select gate control lines 686 at a level sufficient to turn them on. To be able to pass the program inhibit voltage, the pre-charge circuit 682 will set the select gate several volts higher than the bit line level for the inhibited NAND strings. In this example, a select gate pre-charge voltage of VSGDPC=~8V is used for the drain side select gate to be able to pass the program inhibit level of VDDSA=~2.5V. The pre-charge circuit 682 applies this voltage level to the select gates of both unselected sub-blocks (BL (Unselected)), as all on the NAND strings in such sub-blocks are non-selected, and to the select gates of the selected sub-blocks (BL (selected)), as a selected sub-block will include both selected NAND strings and non-selected NAND strings. The pre-charge circuit 682 biases non-selected word lines, both dummy word lines and unselected data word lines and including the word lines adjacent to the drain side select gates, at a non-selected pre-charge level, or program pre-charge bypass voltage, value sufficient to turn them on, such as VISO=~3V, to allow the channel between the selected word line and the bit line to conduct. As used herein, a non-selected voltage level pre-charging a NAND string, a non-selected pre-charge level, or bypass level variously refer to a voltage level sufficient to turn on non-selected memory cells above the regions of the channel to be pre-charged. The pre-charge circuit 682 sets the selected word line at ground. These bias conditions will help to boost the channel for the non-selected NAND strings, reducing the effective voltage seen by the non-selected memory cells when the program pulse is subsequently applied to the selected word line between t5 and t6. Between t3 and t4, all of the waveforms of FIG. 9A are taken to ground long enough to stabilize all of the voltage levels, except for the bit lines corresponding to program inhibited NAND strings, which are held at the program inhibit level of VDDSA.

The boosting phase between t4 and t5 corresponds step 544 of FIG. 7. The bit lines corresponding to non-selected NAND strings are maintained at the program inhibit level (e.g., VDDSA=~2.5V) and bit lines corresponding to selected NAND strings are maintained at the program enable level (e.g., 0V). The drain side select gates of unselected sub-blocks (SGD (Unselected)) are biased at ground, leaving the channels of the NAND strings in these sub-blocks to float.

For the drain side select gates of selected sub-blocks (SGD (Selected)), these are biased at a voltage high enough to turn on the select gates connected to bit lines at the program enable voltage, but not high enough to turn on the select gates connected to bit lines at the program inhibit voltage. In the example here, where the program enable voltage is ground and the program inhibit voltage is VDDSA=~2.5, VSGD=~3V is used. The results in the channels of the selected NAND strings being held at ground, while the non-selected NAND strings are cut-off from their corresponding bits line and left to float. At this point, for unselected NAND strings in a selected sub-block, and all NAND strings in unselected sub-blocks, the channels will have been pre-charged to the program inhibit level between t2 and t3, and then left to float. When the programming pulse is then applied between t5 and t6, the channel can be pulled up, reducing the voltage differential across the charge storing region and inhibiting programming. For the selected NAND strings, the drain side select gate is on, setting the channel to ground so that the selected memory cells see the full programming voltage of the pulse.

With respect to the word lines, the unselected word lines are biased at a relatively high level pass voltage (e.g., VPASS=~10V), so that they will be turned on for any of the data states that they may store, and the dummy word lines will be biased at a somewhat lower voltage (e.g., VGP=~5V) that will still be sufficient to turn the dummy memory cells that are typically programmed at a relatively low threshold voltage. In the boost phase, the selected word line is also at pass voltage (e.g., VPASS=~10V). so that it will also be turned on. At the end of the boost phase, the channels of the selected NAND strings will be biased at ground (or, more generally, the program enable voltage) and the non-selected NAND strings will be program inhibited.

The program pulse phase between t5 and t6 corresponds step 546 of FIG. 7. In the shown embodiment, all of the represented waveforms maintain their values from the boosting phase, except for the selected word line. The selected word line receives the high voltage programming pulse of, for example, VPGM=~20V, where the amplitude of the programming pulse will depend on loop (PC value) of the program algorithm of FIG. 7, which is stepped up at step 560 of each loop. In the embodiment of FIG. 9A.

At the beginning of the pre-charge phase, highlighted by the stippling in FIG. 9A, many of the shown waveforms are raised from ground to a non-zero pre-charge voltage, introducing a voltage gradient between neighboring lines that are being raised to differing levels. In particular, a relatively large differential occurs between the drain side select gate and the adjacent dummy word line (or data word line in an embodiment without a dummy word line) adjacent to the select gate. Referring back to FIG. 4F, for example, the levels illustrated in FIG. 9A raises SGD0 and DD0 from both being at ground to a state where SGD0 is ~5V higher. The transition can induce a disturb, due to hot electron injection from dummy word line region into the charge storage layer in and around the select gate region. As the scale of memory devices shrink, and the control lines are closer, this becomes even more of a problem. FIG. 9B is a schematic representation of this disturb mechanism.

FIG. 9B depicts a portion of a NAND string at the beginning of the program pre-charge, corresponding to the stippled time period following t2 in FIG. 9A. The NAND string of FIG. 9B may be either a selected or non-selected one of the NAND strings connected to the word line selected for the programming operation. For embodiments illustrated with respect to FIGS. 4A-4G, the NAND string of FIG. 9B is connected to word lines WL0-WL95; however, only WL93-95 are depicted in the drawing. The NAND string of FIG. 9A also includes dummy word lines DD0 and DD1 and select gate control line, or selection line, SGD0, although there may be additional select gate control lines between SGD0 and the corresponding bit line. On the source end of the NAND, and also not shown in FIG. 9B, will be any source side select gates and dummy word lines. FIG. 9B also shows a portion of the channel 471 and charge trapping layer 473.

FIG. 9B illustrates the voltage levels on DD0 and SGD0 at the start of the pre-charge operation, typical threshold voltages for these transistors (Vt=~4V and Vt=~3V, respectively), and a representation of the corresponding voltage levels that would typically result along the channel regions under these elements early in the pre-charge operation. The channel region 471 under the data and dummy word lines will be at around −1V, while under the select gate it will be at around 2.2V. The resultant high electric field resulting from this voltage gradient generates electron-hole pairs, as illustrated at 475. The positively charge holes 491 are pulled down the channel 471 in the source direction. The electrons 493 are accelerated by the relatively large voltage level on SGD and can lodge in the charge storage region 473 between DD0 and SGD, and under SGD and on the source side (to the right in FIG. 9B). This phenomenon will be more pronounced for NAND strings nearer the drivers for the select gate control lines, since these will see the fastest rise time, with the select gates further from the driver seeing a slower rise time due to the RC delay along the control lines.

As a consequence of this disturb, the threshold voltage of the drain side select gate will rise, making it more difficult to access the corresponding NAND string. If the threshold value is raised enough, this will affect read values for all the memory cells of the NAND string and, in the extreme case, eventually make the NAND string inaccessible. Because of this, the consequences of the select gate disturb can be significantly worse than for a word line related disturb, as this will affect the data content of only a single memory cell per NAND string, rather than all of the memory cells on a NAND string.

A select gate disturb can also be a greater problem than a memory cell disturb since a memory cell's threshold voltage will be reset when it is rewritten, undoing the previous disturb. Unlike a memory cell, select gates are typically not rewritten once a device has initially been configured, so that the amount of select gate disturb will accumulate over the device's lifetime. Even when a device supports select gate re-programming, this is usually an unusual occurrence and not done on a regular basis.

The elevated threshold voltage from the select gate disturb during programming pre-charge can also lead to an SGD0-DD0 mutual disturb cycle. Referring back to FIG. 9A, during the pulse phase at t5-t6, the dummy word lines will now be biased to a higher voltage than the adjacent select gate, reversing the situation in FIG. 9B and possibly resulting in a disturb of DD0. An increased threshold voltage on a disturbed select gate will aggravate this disturb, as the select gate will effectively see a lower voltage applied, causing more disturb to DD0 during the program phase. Similarly, an elevated DD0 threshold will lead to more disturb on SGD0 in the pre-charge phase. Consequently, once the initial disturb of SGD0 begins, it will trigger a reinforcing feedback loop that issue will accumulate additional trapped charge faster and faster for both the select gate and the dummy word line: A high Vt of DD0 will cause injection disturb on SGD0 during pre-charge, resulting in an SGD0 Vt upshift; and a high Vt of SGD0 will cause injection disturb on DD0 during program, resulting in a DD0 Vt upshift. Consequently, avoiding the select gate disturb during program pre-charge can help to stop the SGD0-DD0 mutual disturb cycle before it even begins.

To avoid generating the high electric field in the region between the select gate and an adjacent word line at the beginning of the program pre-charge, rather than drive the drain side select gate control line at the full pre-charge voltage, the select gates are driven with a sequence of increasing voltage levels that includes one or intermediate values between ground and the final pre-charge level for the select gates. Depending on the embodiment, these multiple steps can include just a single intermediate step, or multiple intermediate steps.

FIGS. 10, 11A, and 12A present some examples of such staircase waveforms for the drain side select gate voltage waveforms. The sequence of voltage levels, or voltage waveform, applied to the drain side select gate control line, can have a number of different embodiments, including the examples of FIGS. 10, 11A, and 12A. These embodiments include two or more steps for the voltage waveform, where each step of the sequence increases, thereby forming a staircase waveform up to a final pre-charge level of the select gates. The height or voltage increase for each of the steps can differ, or be uniform, and their duration can be uniform or differ. In the embodiment of FIG. 10, the staircase voltage waveform includes only an intermediate step and the final step. In the embodiment of FIG. 11A, more than two steps are included in the waveform, where the step can have a uniform step size (increase in voltage) and duration. In the embodiment of FIG. 12A, the staircase waveform again presents an increasing sequence of uniform step size and duration up to an intermediate voltage, and then an increasing sequence of uniform step size and duration from the intermediate voltage to the final value, but where the duration of the steps (and hence the slope) differ before and after the intermediate voltage value. Conventional drivers may be used to change the voltage on the SGD to create a staircase voltage waveform.

As used herein, a waveform, more specifically a voltage waveform, is the value of a voltage level over a period of time and a set of voltage waveforms is the value of multiple voltage levels over a period of time. For example, FIGS. 10, 11A, and 12A present sets of voltage waveforms over a time interval from before t1 until after t6. An individual waveform may vary over the time period, as with the staircase waveforms just discussed, or may be a flat waveform of a constant value during the time period, such as waveform (BL Program) for selected bit lines of cells being programmed in FIGS. 8, 10, 11A, and 12A that is set to ground for all of the shown time period. As discussed further with respect to the embodiments FIGS. 10, 11A, and 12A. the drain side select gate voltage waveform (SGD (unselected) or SGD (selected)) is a voltage staircase formed of a plurality of steps, whereas used herein, a plurality of steps is two or more steps between different voltage levels, where the voltage levels can include both the initial and final voltage levels of the voltage staircase. For example, in the embodiment of FIG. 10 the SGD staircase waveform (SGD (unselected) or SGD (selected)) between times t2 and t3 is formed of two steps, a first step from the initial value to an intermediate value and a second step from the intermediate value to the final value.

FIG. 10 is a set of waveforms for an embodiment where the pre-charge voltage waveform applied to the select gate control include a single intermediate voltage level. FIG. 10 differs from FIG. 9A for the SGD waveform, for both selected and unselected sub-blocks between t2 and t3, but otherwise can be the same. In FIG. 10, instead of directly ramping up SGD to final target (~8V in this example), SGD ramps up in two steps. At t2, the voltage applied by the select gate control line driver for SGD ramps up to an intermediate step, e.g. 50% of final target (e.g., ~4V). This allows drain side potential in the channel (2.2V in this example) to move from the drain end towards DD0 much more slowly, resulting in less of a voltage gradient and thus significantly reducing the electrical field in the SGD-DD0 region. As a result, fewer electron-hole pairs are generated. At the same time, the SGD bias is still low (~4V), so there is much less of an electrical field to accelerate any generated electrons towards the select gate, reducing electron injection. Such a two step ramp up can provide for a waveform that ramps up reasonably slowly and helps to avoid electron-hole pair generation and hot electron injection.

As this intermediate select gate voltage may not be sufficient to properly pre-charge the NAND strings, at time t2' the SGD voltage from the driver further increases from the intermediate level (~4V) to the final target (~8V). Because this allows more time for channel potential neutralization, the potential gradient is much smaller now, and there is little or no hot electron injection even through SGD reaches its final target of 8V.

In the example of FIG. 10, the intermediate level was taken to be ~50% of the final SGD level, but other intermediate levels can be used in other embodiments. Although FIG. 10 uses a staircase waveform of only two steps, other variation can use more steps, either of varying or uniform size and duration.

Figure 11B:
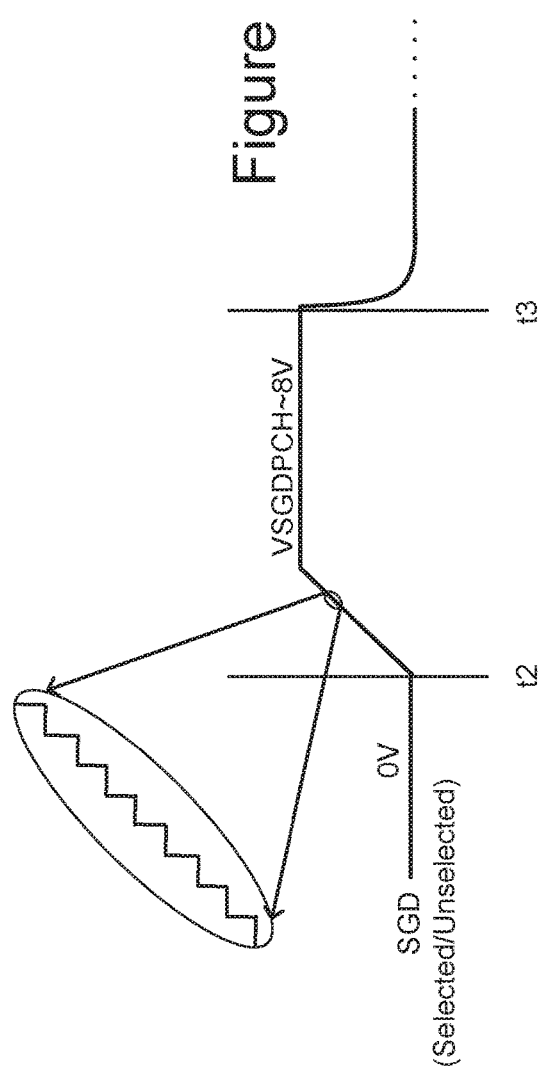
FIGS. 11B and 12B are a detail of respective FIGS. 11A and 12A.

For example, FIG. 11A presents an embodiment using a ramp-like sequence of steps for the staircase waveform, where the steps are of uniform size and duration. As with FIG. 10, aside from the voltage provided by the SGD drivers between t2 and t3, the waveforms in FIG. 11A can be the same as in FIG. 9A. Instead of directly ramping up SGD to the final target (~8V) freely at t2, SGD ramps up with a linear voltage rate control circuit. In FIG. 11A, the SGD voltage is represented as a ramp, but, as shown in more detail in FIG. 11B, the level is increased as a sequence of small steps. FIG. 11B expands out a detail of the ramp of FIG. 11A, showing it to be a staircase with steps of uniform size and duration, where the step size can correspond to the select gate control line driver incrementing the voltage supply's digital value by a single bit or just a few bits.

Because of a slower ramp up rate, the drain side potential (e.g., 2.2V) will more gradually move towards DD0, thus significantly reduce the voltage gradient and resultant electric field in the SGD-DD0 region of the channel. As a result, less electron-hole pairs are generated. Additionally, the slower ramp up rate reduces the SGD-channel voltage difference at any given time, reducing the amount of hot electron injection from any electron-hole pairs that are generated. Consequently, the the ramp rate control illustrated in FIG. 11A can provide that the voltage applied by the drivers to the select gate control lines ramp up reasonably slowly to avoid electron-hole pair and hot electron injection.

Figure 12B:
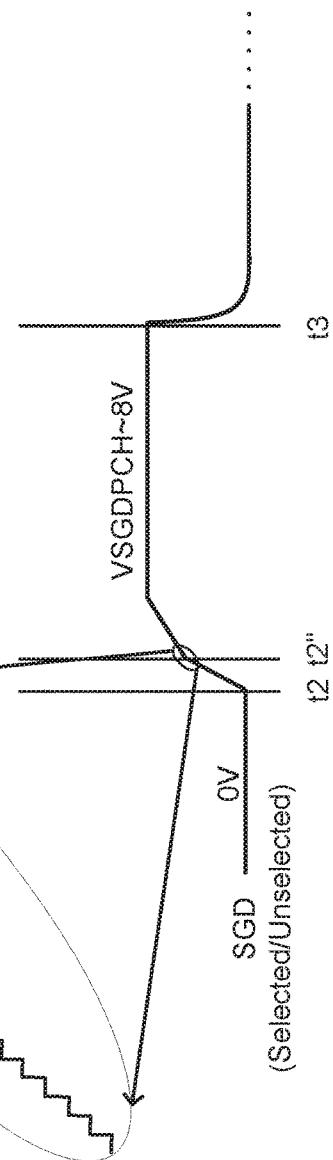

FIG. 12A illustrates another embodiment, where, instead of directly ramp up SGD to final target (~8V) freely at t2, SGD ramps up with a non-linear voltage rate control circuit. The embodiment of FIG. 12A can be thought of as an extension of the embodiment of FIG. 11A, but where the slope of the ramping stair case changes, which can be more efficient as the slope can be tuned to the device's characteristics. In the example of FIG. 12A, the ramp begins at t2 with a first ramp rate, then at t2" switches to a second ramp rate. FIG. 12B is a detail of FIG. 12A around t2", showing the two ramp rates are again a staircase with the series of steps initially being of a first size increasing at a first rate, followed by a series of steps of a second size increasing at a second rate from the intermediate value to the final value. In this particular example, starting at t2 at the beginning ramp (0V→4V), the SGD value can ramp up fast because electron-hole generation is small in this range. At t2", the second ramp rate begins. For SGD values in this range (4V→8V), where electron-hole generation is stronger, the drivers slow down the ramp rate to reduce the likelihood of electron-hole generation and the amount of hot electron injection for any electrons that are generated.

Figure 13:
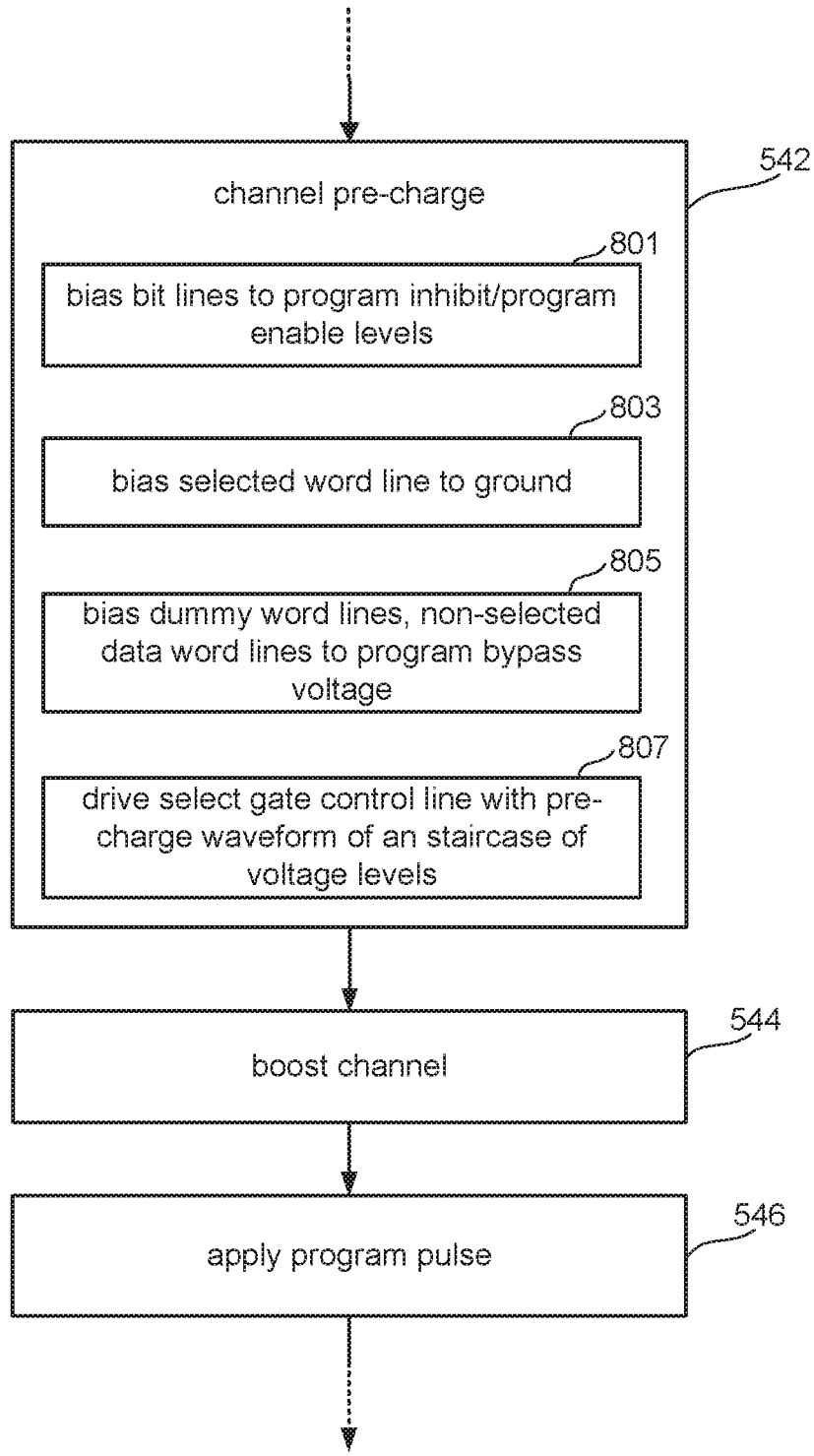
FIG. 13 is a flow chart describing one embodiment of the pre-charge operation of FIG. 7 in more detail.

FIG. 13 is a flow chart describing embodiments of a process for pre-charging that implements the proposed countermeasures for the above-described program disturb by applying an increasing sequence of voltage levels to pre-charge the select gates. More specifically, FIG. 13 provides more detail for step 542 of FIG. 7.

FIG. 13 looks at steps 542-546 from FIG. 7, adding sub-steps of the pre-charge phase, such as illustrated in the embodiments of FIGS. 10, 11A and 12A between t2 and t3. In step 801, the bit lines are biased to the program inhibit level (e.g., ~2.5V) for the bit lines corresponding to NAND strings connected to the selected word line that are not to be programmed and are biased to the program enable level (e.g., ~0V) for the bit lines corresponding to selected NAND strings. These bit line levels can be set by the read/write circuits 328, including the sense blocks 350 of FIG. 2, the pre-charge circuit 682, control circuit 690 of FIG. 13, or a combination of these and other elements on the memory device, depending on the embodiment.

In step 803, the selected word line is biased at ground. The non-selected word lines, both dummy word lines and data word lines, are biased with a non-selected pre-charge level, or program pre-charge bypass voltage level, at step 805. In the embodiments described above with respect to FIGS. 4A-4G, the word line adjacent to a select gate is dummy word line, but in other embodiments this may be a data word line. The bias levels of the word lines can be biased by the pre-charge circuit 682, control circuit 690 of FIG. 13, row decoder 324 of FIG. 2, or a combination of these and other elements on the memory device, depending on the embodiment. For example, as illustrated in FIG. 8, the pre-charge circuit 681 of control circuit 690 is connected to the word lines 688 to bias these elements during the pre-charge sub-operations of steps 803 and 805.

Step 807 biases the drain side select gate control lines with their pre-charge waveforms, driving these control lines with a staircase waveform of a sequence of voltage levels sequentially increasing to the final select gate pre-charge voltage. In the example of FIG. 10, only two steps are used, where the SGD control line is initially raised to an intermediate level, and then on to the final pre-charge level. Other embodiments can use different numbers of steps of different sizes and durations. For the example of FIGS. 11A and 11B, a ramp-like staircase of uniform step size and duration is used. The example of FIGS. 12A and 12B uses multiple ramp rates for the staircase waveform, initially ramping up more quickly for increased performance, then more slowly in the high voltages that are more likely to generate electron-hole pairs. The bias levels of the select gate control lines can be biased for these different embodiments by the pre-charge circuit 682, control circuit 690 of FIG. 13, row decoder 324 of FIG. 2, or a combination of these and other elements on the memory device, depending on the embodiment. For example, as illustrated in FIG. 8, the pre-charge circuit 681 of control circuit 690 is connected to the select gate control lines to bias these elements during the pre-charge sub-operations of step 807.

The preceding discussion was given in the context of mitigating the disturb of drain side select gates during the pre-charge phase of a programming operation, as the bias conditions that can lead to such a disturb can arise is such an operation. However, the techniques described can be applied more generally during the operation of memory systems to other situations where a select gate is biased to a higher voltage than an adjacent dummy or data word line, both for situations other than a programming pre-charge and for source side select gates. For example, if a source side select gate is biased to a higher voltage than an adjacent word line or control line, the voltage applied to the source side select gate can be raised in steps as described above. This could occur if, for example, a NAND string is pre-charged for from the source side instead of or in addition to being charged from a bit line. With respect to other types of operations, the channel conditions illustrated with respect to FIG. 9B could also arise in a sensing operation, for example, if the adjacent dummy word line has a high threshold voltage.

One embodiment includes an apparatus with a select gate control line connected to a first select gate, a first word line connected to a first memory cell, and a second word line connected to a second memory cell. The second memory cell is connected in series with the first memory cell and the first select gate and located adjacent to the first select gate. A pre-charge circuit is configured to pre-charge a channel coupled to the first select gate, the first memory cell and the second memory cell by concurrently biasing the first word line to ground; driving the second word line at a non-selected pre-charge level above ground; and driving the select gate control line with a voltage waveform of a plurality of steps increasing from ground to a voltage level higher than the non-selected pre-charge level. A programming circuit is configured to apply a program pulse to the first word line subsequent to pre-charging the channel.

One embodiment includes an apparatus having a NAND string and a control circuit connected to the NAND string. The NAND string includes a selected memory cell and a non-selected memory cell, the non-selected memory cell located on the NAND string adjacent to a select gate. The control circuit is configured to program the selected memory cell by a series of pulse operations, each pulse operation including applying a pulse to the selected memory cell and, prior to the applying the pulse, pre-charging the NAND string by applying an increasing sequence of a plurality of voltage levels to the select gate while applying a non-selected voltage level to the non-selected memory cell, one or more of the voltage levels of the increasing sequence of voltage levels being greater than non-selected voltage level.

One embodiment includes a method that includes pre-charging a NAND string and, subsequent to pre-charging the NAND string, applying a programming pulse to a second word line connected the selected memory cell. Pre-charging the NAND string includes: driving a control line connected to a select gate with a staircase waveform of a sequence of voltage levels sequentially increasing to a select gate pre-charge voltage; and, while driving the select gate with the staircase waveform, biasing a word line connected to a non-selected memory cell with a bypass voltage, where the non-selected memory cell is adjacent to the select gate and is between the select gate and a selected memory cell on the NAND string, and the bypass voltage is lower than the select gate pre-charge voltage.

One embodiment includes an apparatus that includes an array of non-volatile memory cells including a plurality of NAND strings. Each NAND string includes a select gate through which the NAND string is connected to a corresponding bit line, a first memory cell adjacent to the select gate and a second memory cell. Each of the select gates is connect to a select line, each of the first memory cells is connected to a first word line, and each of the second memory cells is connected to a second word line. The apparatus also includes means for programming the second memory cell on selected ones of the NAND strings and means for pre-charging the plurality of NAND strings, including both the selected NAND strings and non-selected ones of the NAND strings, for the programming. The pre-charging includes biasing bit lines corresponding to the selected NAND strings to a program enable value, biasing bit lines corresponding to non-selected NAND strings to a program inhibit value, biasing the first word line to turn on the first memory cells, and biasing the select line with a rising waveform having a plurality of steps increasing to a value sufficient to turn on the select gates of the non-selected NAND strings.

Means for programming can include controller 120, control circuitry 310, state machine 312 in combination with power control circuit 316, programming circuit 680 or control circuit 690. The means for programming can include dedicated hardware (e.g., electrical circuit), a processor programmed by software, an FPGA, a state machine, a microcontroller or equivalent thereof, as well as voltage generators (e.g., charge pumps). The means for programming performs step 546 of FIG. 7, as well as provides the signals of FIG. 10, 11A or 12A between t5 and t6.

Means for pre-charging the NAND strings can include controller 120, control circuitry 310, state machine 312 in combination with power control circuit 316, pre-charge circuit 682 or control circuit 690. The means for pre-charging the NAND strings can be implemented by dedicated hardware (e.g., electrical circuit), a processor programmed by software, an FPGA, a state machine, a microcontroller or equivalent thereof, as well as voltage generators (e.g., charge pumps). The means for pre-charging the channels performs step 542 of FIG. 7 and/or steps 801, 803, 805, and 807 of FIG. 13, as well as provides the signals of FIG. 10, 11A or 12A between t2 and t3.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
   a select gate control line connected to a first select gate;
   a first word line connected to a first memory cell;
   a second word line connected to a second memory cell, the second memory cell connected in series with the first memory cell and the first select gate and located adjacent to the first select gate; and
   a pre-charge circuit configured to pre-charge a channel coupled to the first select gate, the first memory cell and the second memory cell by concurrently:
      biasing the first word line to ground;
      driving the second word line at a non-selected pre-charge level above ground; and
      driving the select gate control line with a voltage waveform of a plurality of steps increasing from ground to a voltage level higher than the non-selected pre-charge level; and
   a programming circuit configured to apply a program pulse to the first word line subsequent to pre-charge the channel.

2. The apparatus of claim 1, further comprising:
   a first bit line, the first memory cell and second memory cell connected to the first bit line through the first select gate, wherein the pre-charge circuit is further configured to bias the first bit line at ground while driving the select gate control line with the voltage waveform.

3. The apparatus of claim 2, further comprising:
   a second bit line;
   a second select gate connected to the select gate control line;
   a third memory cell connected to the first word line; and
   a fourth memory cell connected to the second word line, the third and fourth memory cells connected to the second bit line through the second select gate, wherein the pre-charge circuit is further configured to bias the second bit line at a program inhibit voltage greater than ground while driving the select gate control line with the voltage waveform.

4. The apparatus of claim 1, wherein the plurality of steps includes a first step having a voltage level higher than the non-selected pre-charge level and a subsequent second step having a voltage level higher than the first step.

5. The apparatus of claim 1, wherein the plurality of steps includes a sequence of three or more steps of a common size increasing at a constant rate.

6. The apparatus of claim 1, wherein the plurality of steps includes a first sequence of a plurality of steps of a first size increasing at a first rate to an intermediate value, followed by a plurality of steps of a second size increasing at a second rate from the intermediate value to a final value.

7. The apparatus of claim 1, wherein the first select gate is a drain side select gate.

8. The apparatus of claim 1, wherein the second word line is a dummy word line.

9. An apparatus, comprising:
   a NAND string, including a selected memory cell and a non-selected memory cell, the non-selected memory cell located on the NAND string adjacent to a select gate; and
   a control circuit connected to the NAND string and configured to program the selected memory cell by a series of pulse operations, each pulse operation including applying a pulse to the selected memory cell and, prior to the applying the pulse, pre-charging the NAND string by applying an increasing sequence of a plurality of voltage levels to the select gate while applying a non-selected voltage level to the non-selected memory cell, one or more of the voltage levels of the increasing sequence of voltage levels being greater than non-selected voltage level.

10. The apparatus of claim 9, wherein the increasing sequence of voltage levels includes a first step having a voltage level higher than the non-selected voltage level and a subsequent second step having a voltage level higher than the first step.

11. The apparatus of claim 9, wherein the increasing sequence of voltage levels includes a sequence of three or more steps of a common size increasing at a constant rate.

12. The apparatus of claim 9, wherein the increasing sequence of voltage levels includes a first sequence of a plurality of steps of a first size increasing at a first rate to an intermediate value, followed by a plurality of steps of a second size increasing at a second rate from the intermediate value to a final value.

13. The apparatus of claim 9, wherein apparatus comprises a memory array of a monolithic three-dimensional semiconductor memory device in which the memory cells are arranged in multiple physical levels above a silicon substrate and comprise a charge storage medium.

14. A method, comprising:
    pre-charging a first NAND string, comprising:
       driving a control line connected to a first select gate with a staircase waveform of a sequence of voltage levels sequentially increasing to a select gate pre-charge voltage; and
       while driving the first select gate with the staircase waveform, biasing a first word line connected to a non-selected memory cell with a bypass voltage, where the non-selected memory cell is adjacent to the first select gate and is between the first select gate and a selected memory cell on the first NAND string, and the bypass voltage is lower than the select gate pre-charge voltage; and
    subsequent to pre-charging the first NAND string, applying a programming pulse to a second word line connected the selected memory cell.

15. The method of claim 14, wherein the first NAND string is connected to a first bit line through the first select gate, and pre-charging the first NAND string further comprises:
    biasing the first bit line at ground.

16. The method of claim 15, wherein programming the selected memory cell further comprises:
    concurrent with pre-charging the first NAND string, pre-charging a second NAND string having a first memory cell connected to the first word line, a second memory sell connected to the second word line, and a second select gate connected to the control line, wherein the second NAND string is connected to a second bit line through the second select gate and pre-charging the second NAND string includes:
       biasing the second bit line at program inhibit voltage.

17. The method of claim 14, wherein the staircase waveform includes a first step having a voltage level higher than the bypass voltage and lower than the select gate pre-charge voltage, and a subsequent second step having a voltage level at the select gate pre-charge voltage.

18. The method of claim 14, wherein the staircase waveform includes a sequence of three or more steps of a common size increasing at a constant rate.

19. The method of claim 14, wherein the staircase waveform includes a first sequence of a plurality of steps of a first size increasing at a first rate to an intermediate value, followed by a plurality of steps of a second size increasing at a second rate from the intermediate value to the select gate pre-charge voltage.

20. An apparatus, comprising:
an array of non-volatile memory cells including a plurality of NAND strings, each NAND string including a select gate through which the NAND string is connected to a corresponding bit line, a first memory cell adjacent to the select gate and a second memory cell, wherein each of the select gates is connect to a select line, each of the first memory cells is connected to a first word line, and each of the second memory cells is connected to a second word line;
means for programming the second memory cell on selected ones of the NAND strings; and
means for pre-charging the plurality of NAND strings, including both the selected NAND strings and non-selected ones of the NAND strings, for the programming, the pre-charging including biasing bit lines corresponding to the selected NAND strings to a program enable value, biasing bit lines corresponding to non-selected NAND strings to a program inhibit value, biasing the first word line to turn on the first memory cells, and biasing the select line with a rising waveform having a plurality of steps increasing to a value sufficient to turn on the select gates of the non-selected NAND strings.

* * * * *